(12) United States Patent
Shimpuku

(10) Patent No.: US 6,451,688 B1
(45) Date of Patent: Sep. 17, 2002

(54) METHOD FOR MANUFACTURING A SEMICONDUCTOR DEVICE

(75) Inventor: Fumihiko Shimpuku, Kuwana (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/996,761

(22) Filed: Nov. 30, 2001

(30) Foreign Application Priority Data

Dec. 4, 2000 (JP) ........................................ 2000-369323

(51) Int. Cl.$^7$ .......................................... H01L 21/4763
(52) U.S. Cl. ........................ 438/624; 438/637; 438/638; 438/686; 438/687
(58) Field of Search ................................ 438/623–625, 438/627–629, 637–638, 685–687

(56) References Cited

U.S. PATENT DOCUMENTS 6,333,258 B1 * 12/2001 Miyata et al. ............... 438/637
6,350,674 B1 * 2/2002 Okamura .................... 438/624
6,376,366 B1 * 4/2002 Lin et al. .................... 438/637

* cited by examiner

Primary Examiner—John F. Niebling
Assistant Examiner—Lynne Gurley
(74) Attorney, Agent, or Firm—Armstrong, Westerman, & Hattori, LLP

(57) ABSTRACT

A manufacturing process which enables the opening of a downwardly protruding window for a dual damascene structure, etc. both easily and in a well-controlled fashion even in a case where the opening is small. After a depression constituted by a silicon nitride film, etc. has been configured above an interlayer insulating film, a mask is obtained by configuring a window on a portion of it in such a way that said interlayer insulating film will become bared to its bottom. Next, this mask is etched back, followed by the etching of the interlayer insulating film underneath, as a result of the interlayer insulating film becomes etched while the thickness disparity within the mask is being reflected by the corresponding attribute of the interlayer insulating film underneath, and accordingly, a downwardly protruding window (e.g., dual damascene structure, etc.) can be easily formed within said interlayer insulating film. The window which has been formed as a result of such a process is useful not only as a wire layer but also as a capacitor.

13 Claims, 28 Drawing Sheets

"Prior Art"

"Prior Art"

"Prior Art"

"Prior Art"

"Prior Art"

"Prior Art"

"Prior Art"

"Prior Art"

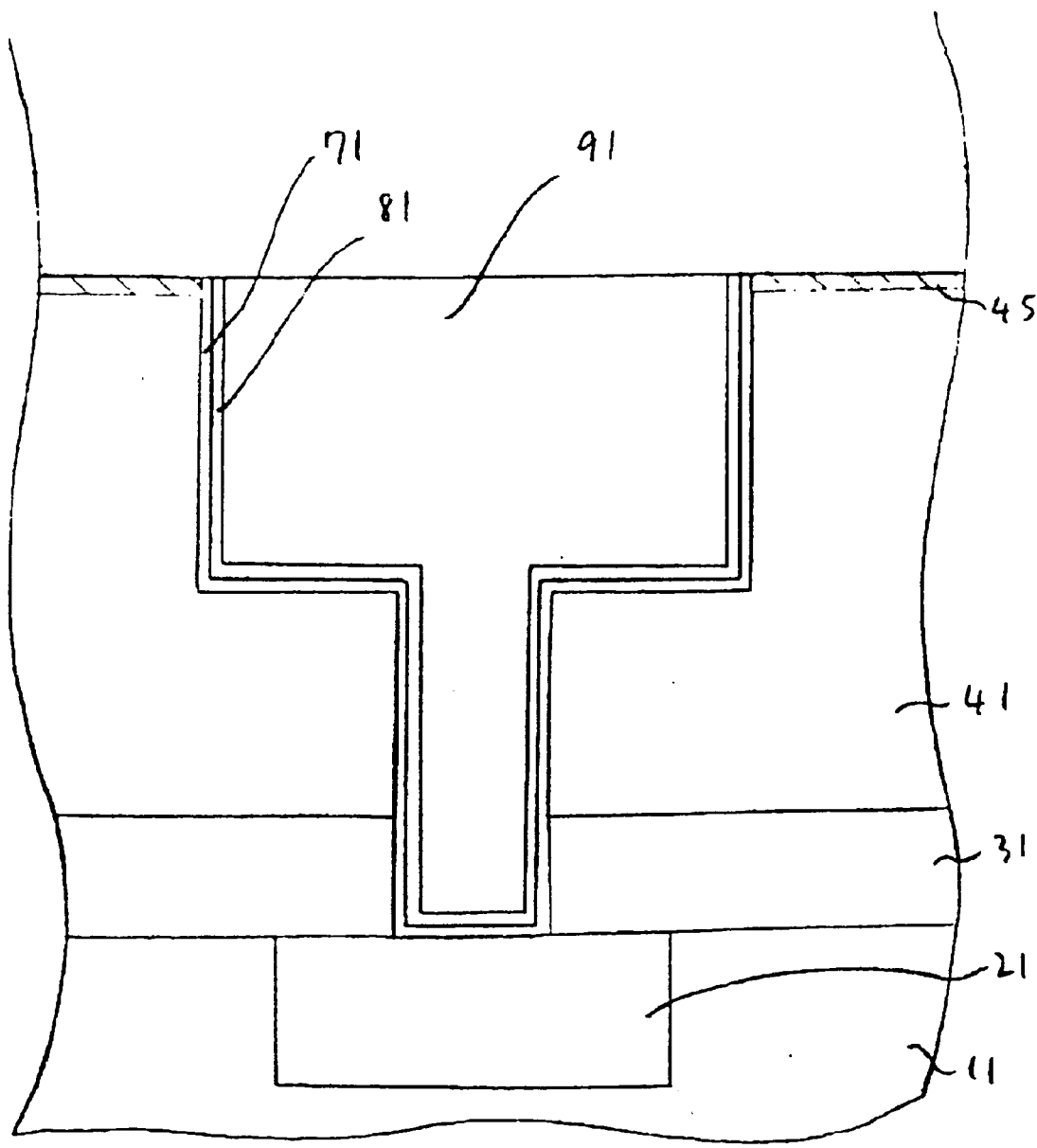
F I G. 18

METHOD FOR MANUFACTURING A SEMICONDUCTOR DEVICE

This application is based upon and claims priority of Japanese Patent Application No. 2000-369323, filed, the contents being incorporated herein by reference.

FIELD OF THE PRESENT INVENTION

The present invention concerns an improved method for forming an opening which possesses a step differential patternwise.

BACKGROUND OF THE INVENTION

Prospects of practically mass-producing Cu (copper) wire layers in place of extant Al (aluminum) wire layers have come to be vigorously investigated from the standpoint of lowering the intrinsic electrical resistance values of wire layers, which has been become urgent in response to the size reductions of wire layers, which inevitably accompany attempts to reduce the sizes of semiconductor devices. Unlike the Al (aluminum), however, the Cu (copper) is an extremely difficult material to process due to production process-related limitations, and it is indispensable to develop unprecedented techniques for both blanketwise formation processes and patterning processes, and accordingly, a so-called "dual damascene structure," which possesses a downwardly protruding cross-sectional shape, has come to be proposed as the shape of an opening for configuring a wire layer within an interlayer insulating film.

The present invention provides a technique which is most desirable as an improved opening formation process for this dual damascene structure.

First, dual damascene wiring processes of the prior art will be explained with reference sequentially to FIGS. 1 through 6.

FIGS. 1 through 6 show cross-sectional views during the respective processes of the dual damascene wiring technique of the prior all, and cross-sectional appearances of the apparatus corresponding to the respective processes are thereby shown modelwise. The cross-sectional structure of the dual damascene wire layer is characterized by an approximately downward protrusion, and this technique of the prior art may therefore be said to be founded roughly on the following concept. In other words, an interlayer insulating film is first etched halfway by using a resist mask which possesses a large opening, and after it has subsequently been substituted with a resist mask which possesses a smaller opening, a window is formed on the interlayer insulating film in such a way that the segment of the interlayer insulating film the thickness of which has become reduced as a result of the halfway etching alone will become etched through to the lower wire layer.

Next, such a technique of the prior art will be explained in detail below, see FIG. 1.

As far as the dual damascene wiring processes of the prior art are concerned, the impurity electroconductive layer (2), which serves as a wire layer, is first configured within the semiconductor substrate (1), and subsequently, the etching stopper (3), the interlayer insulating film (4), and the resist mask (5) are formed in proper order above it. The resist mask (5) is patterned by using a well-known photolithographic technique. Next, the interlayer insulating film (4) is selectively removed based on a dry etching technique via the window which has been formed within the resist mask (5) photolithographically, as shown in FIG. 2.

In such a case, the etching of the interlayer insulating film (4) is stopped at a stage where the etching depth remains shallow enough not to reach the base underneath completely, as a result of which a depression is configured within the interlayer insulating film (4). The resist mask (5) is subsequently removed by means of ashing, as shown in FIG. 3.

The resist mask (6) is coated anew on the entire plane of the interlayer insulating film (4), including the depression configured earlier. A window is formed on this resist mask (6) based on a well-known photolithographic technique. As FIG. 4 illustrates, the width of the window thus formed is sufficiently narrower than the width of the depression while the step differential imputed to the depression is being bared to its bottom.

Next, the interlayer insulating film (4) is selectively etched by using the resist mask (6). In such a case, the etched segment of the interlayer insulating film (4) includes the step differential, and therefore, in a case where the etching is terminated at the stage where the etching stopper (3) has become bared to the bottom of the interlayer insulating film (4), the step differential shown in FIG. 5, which has fundamentally inherited the traits of the initial step differential, comes to emerge within the window. Subsequently, the resist mask (6) is removed by means of ashing, as shown in FIG. 5.

Next, the etching conditions are redesignated, and the etching stopper (3), which has come to become bared to the bottom of the interlayer insulating film (4), is removed, as a result of which the window becomes etched through to the impurity electroconductive layer (2). Thus a dual damascene window with a downwardly protruding shape is formed in the interlayer insulating film (4), as shown in FIG. 6.

A thin tantalum nitride (TaN) layer (not shown), furthermore, is formed on the inner wall of the dual damascene window by means of sputtering. This layer, which serves as a barrier layer for preventing the diffusion of a copper (Cu) wire layer to be formed later toward the interlayer insulating film (4), is an indispensable element for the copper (Cu) wire constitution of a dual damascene structure. Next, a thin copper (Cu) seed layer (not shown) is formed on the surface of the tantalum nitride (TaN) layer by means of sputtering. This copper (Cu) seed layer serves the function of a seed layer during a plating process whereby the interior of the dual damascene window is completely filled with the copper (Cu) layer (9). A film that constitutes the copper (Cu) layer (9) is formed at a sufficient thickness based on the plating method in such a way that it will bulge from the window initially, but the bulge beyond the dual damascene window is subsequently removed based on the CMP (chemicomechanical polish) method, as a result of which the cross-sectional shape shown in FIG. 6 is achieved.

Thus, the processes of the prior art for forming a copper (Cu) dual damascene wire constitution has been explained.

The dual damascene wiring technique of the prior art is plagued with fatal problems which cannot be overlooked in the context of size reduction, and they will be explained below.

FIG. 7, which corresponds to the process shown in FIG. 3, which has been referred to earlier, is a diagram which shows a cross-sectional view of a state where the process is in progress and which points out the first problem of the prior art. The etching stopper (3) and the interlayer insulating film (4) are formed in proper order above the semiconductor substrate (1), on the surface of which has been formed the impurity electroconductive layer (2) previously, and a depression is formed patternwise within the interlayer insulating film (4) by means of selective etching. In such a case, the interlayer insulating film (4) is not etched through as a result of etching, but rather, the etching is terminated halfway along the thickness of the interlayer insulating film (4) in the context of configuring said depression. Next, the resist mask (6) is formed blanketwise over the entire plane of the interlayer insulating film (4), including the depression, and a subsequent operation for patterning a resist mask opening is carried out based on a well-known photolithographic method. In a case where a resist of the negative type is hereby assumed to be used, exposure beams become scattered under the pervasion of the step differential in the interlayer insulating film (4), and accordingly, patterning irregularities are incurred in the region on which the resist mask opening is to be formed during an operation for transferring a negative pattern. A mask is configured on a plane that includes the step differential in the case of the transfer of the negative pattern, and the step differential segment should ideally remain unexposed to beams. Due to the beam scatters in the vicinity of the step differential, however, the region which should be masked becomes exposed to the beams, which is problematic in that the crucial fringe portions of the resist pattern become significantly irregular. The following problem, however, remains unsolved even in a case where the aforementioned scatters of exposure beams can be inhibited: A chemical amplification-type resist, which is patterned under the pervasion of an acid which has been generated as a result of beam exposure, has come to be used almost exclusively in recent years, but in the case of such a chemical amplification-type resist, the acid which has been generated from an optical acid generator which has been internalized in it becomes consumed by traces of amine, ammonia, etc., which become scattered into the air in the vicinity of the resist coating film surface, which is problematic in that an accurate pattern cannot be formed as a result of a development and that the shapes of the developed pattern tends to become irregular. Such a problem of the pattern morphological irregularity (e.g., sleeve formation, etc.),becomes especially grave in a case where a microscopic device, wherein the proximity between the step differential segment of an interlayer insulating film and a window is high, and as FIG. 7 indicates, the sleeve which has been formed on the resist pattern fringe completely covers the step differential of the interlayer insulating film, which is in turn problematic in that it becomes impossible to open a window even in a case where a dry etching process is implemented. The first problem of the prior art has been thus explained. In a case where this mode of defect arises, the obtained product is obviously unshippable, as a result of which the yield decreases.

FIG. 8, which corresponds to the process shown in FIG. 3, which has been referred to earlier, is a diagram which shows a cross-sectional view of the process in progress and which points out the second problem of the prior art. The respective elements shown and numerically notated in FIG. 8 are identical to the elements which bear the corresponding notations in FIG. 7.

The second problem concerns the problem of a contact resistance gain. Even if the sleeve problem of the resist can somehow be solved, a small window is independently positioned and opened without being aligned against the step differential segment of the interlayer insulating film, and therefore, the proximity between the step differential segment and the window to be opened inevitably becomes high, as a result of which the bottom of the window tends to become small. The case shown in FIG. 8 pertains to one where the corners of the depression configured on the interlayer insulating film (4) are blanketed by the window of the resist mask (6). In such a case, slight positioning imprecisions come to affect the size of the contact plane, namely the magnitude of the contact resistance, and in an extreme case, the yield must be considered to become low. Even if such an extreme can be avoided, the device performances may diminish, or a secondary problem of having to designate and adjust other process conditions more severely may arise. Even in a case where an attempt is made to form a resist mask by forming a small window in the interior of a shallow and large depression which has been formed on the interlayer insulating film in such a way that it will not overlap the fringe plane of the depression (step differential segment), on the other hand, the fact that the resist thereby prevails as a mask for opening a window deep enough for baring the contact plane underneath remains unchanged. Thus, the interior of the interlayer insulating film must be subjected to two etching processes while mutually independent resist masks are being used on the respective occasions, and the residues which have been emitted from the resists which serve as the etching masks and which have become adhered to the surface must be removed twice. Such residues are normally removed by means of chemical solution treatments, and in a case where such treatments are performed twice, the prospects of the chemical solution becoming significantly absorbed into the films which constitute the respective layers and of unfavorable consequence being incurred as a result of its scatter during a subsequent thermal treatment become more likely. The initial etching operation for configuring the depression is also problematic in that it is difficult to control the etching magnitude for forming the designed dual damascene structure by terminating the etching halfway in the midst of the interlayer insulating film without reference to a clear-cut etching end point. The second problem of the prior art has been thus explained.

As the foregoing first and second problems shown in FIGS. 7 and 8, respectively, which have been explained individually, suggest, it is generally difficult to secure a sufficient contact area based on the processes of the prior art for manufacturing a dual damascene wire structure, and in an extreme case, a complete failure to open a window, which is a fatal flaw, may be incurred. It is inevitable for the consequence of such an inconvenience to become more grave as the device size decreases, and therefore, it has become urgent to develop a novel technique for manufacturing a dual damascene wire structure, wherein a sufficient contact area can be secured.

SUMMARY OF THE INVENTION

The constitutions shown below are provided by the present invention as mechanisms for solving the aforementioned problems of the prior art.

That is, the present invention has adopted a process for transferring a step differential which has been configured on a hard mask onto an interlayer insulating film underneath in the context of forming a dual damascene structure. In other words, a locally shallow section is configured on a hard mask, and the shallow portion is initially depleted selectively and partially. Subsequently, the entire plane of a region of the hard mask pattern to be transferred to be base underneath is etched. A downwardly protruding dual damascene structure can in effect be formed in this method based solely on the etching rate differential between the interlayer insulating film and the hard mask formed above it. A contact plane, furthermore, is opened after the removal of the resist, and therefore, the problems of the prior art attributed to resist residues (e.g., contact defect, etc.) can first be eliminated. Even in a case where a microscopic and narrower dual damascene structure is prepared, furthermore, a window can be smoothly opened. The resist has been the window width determining factor in the prior art, and in an extreme case, it may become impossible to open a window even under the pervasion of a slight sleeve, or the problem of a failure to open a window of a desired width may arise. These problems can be utterly eliminated in the present invention, which has adopted a hard mask transfer modality. An attempt was made in the prior art to alleviate the problem of the resist sleeve by opening a mask window while it is being aligned against a step differential plane, but in a case where such a process is implemented, a failure to open a window completely or a failure to open a window of a desired width becomes inevitable unless the mask and step differential are accurately positioned and aligned. As far as the present invention is concerned, on the other hand, there is no need to mutually position and align the resist pattern and the shallow portion within the hard mask accurately, and so long as a window becomes opened at any position within the depression, neither a resistance value variation of a wire to be formed on it later nor a contact resistance value variation is incurred, which is beneficial in that a dual damascene wire structure can be formed with relative ease without recourse to a precise positioning and aligning operation.

BRIEF DESCRIPTION OF THE DRAWINGS

FIG. 18 is a diagram which shows a cross-sectional view of still another process in progress with regard to the first embodiment of the present invention.

Explanation of Notations (1): Semiconductor substrate; (11): Interlayer insulating film; (12): Interlayer insulating film; (101): Base layer; (2): Impurity electroconductive layer; (21): Copper (Cu) wire layer; (22): Copper (CL) wire layer; (3): Etching stopper; (31): Silicon nitride film (protective film); (32): Silicon nitride film (protective film); (301): Silicon nitride film; (302): Silicon nitride film; (303): Silicon nitride film; (4): Interlayer insulating film; (41): Silicon oxide film (interlayer insulating film); (42): Silicon oxide film (interlayer insulating film); (45): Silicon nitride film; (46): Silicon nitride film; (401): interlayer insulating film; (5): Resist mask; (51): Resist mask; (52): Resist mask; (6): Resist mask; (61): Resist mask; (62): Resist mask; (71): Tantalum nitride (TaN) film; (81): Copper (Cu) seed layer; (82): Copper (Cu) seed layer; (9): Copper (Cu) layer; (91): Copper (Cu) layer; (92): Copper (Cu) layer; (901): Copper (Cu) seed layer.

DETAILED DESCRIPTION OF THE PREFERRED EMBODIMENTS

In the following, desirable application embodiments of the present invention will be explained with reference to FIGS. 9–28.

FIGS. 9 through 18 are diagrams which show the respective processes of the first embodiment according to the present invention.

Figure 1:
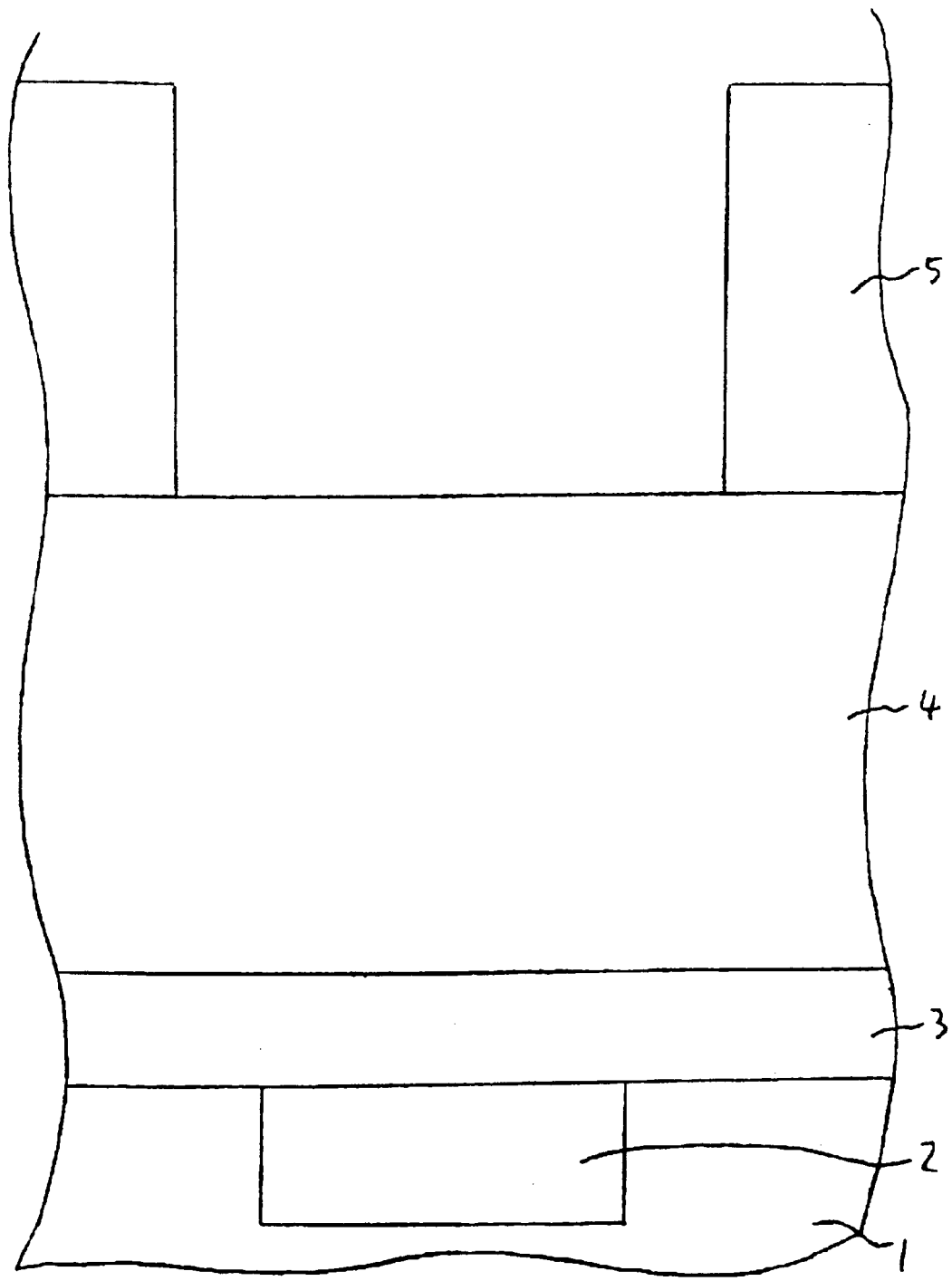
FIG. 1 is a diagram which shows a cross-sectional view of a process of a dual damascene wiring technique of the prior art in progress.
Figure 2:
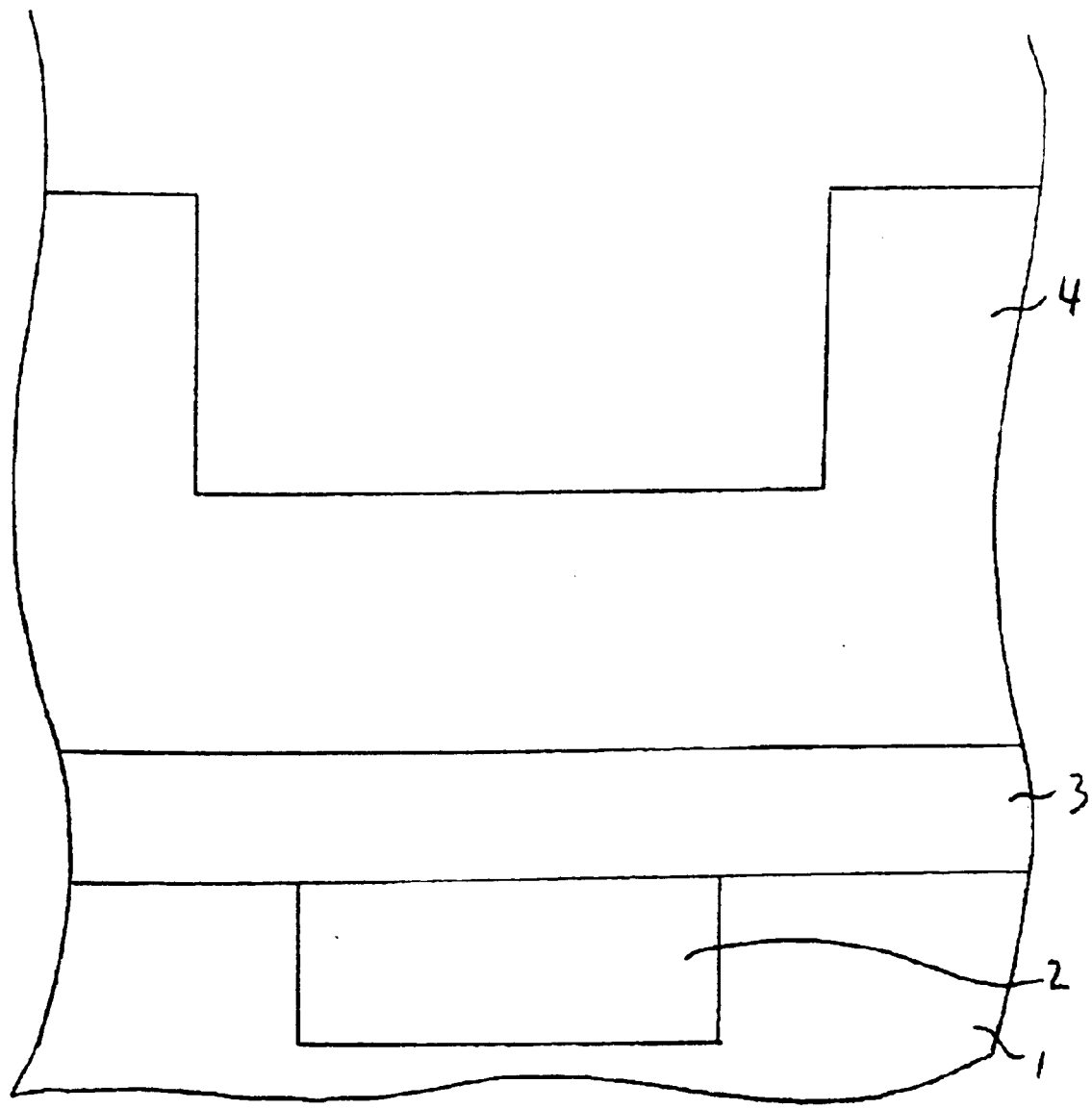
FIG. 2 is diagram which shows a cross-sectional view of another process of the dual damascene wiring technique of the prior art in progress.
Figure 3:
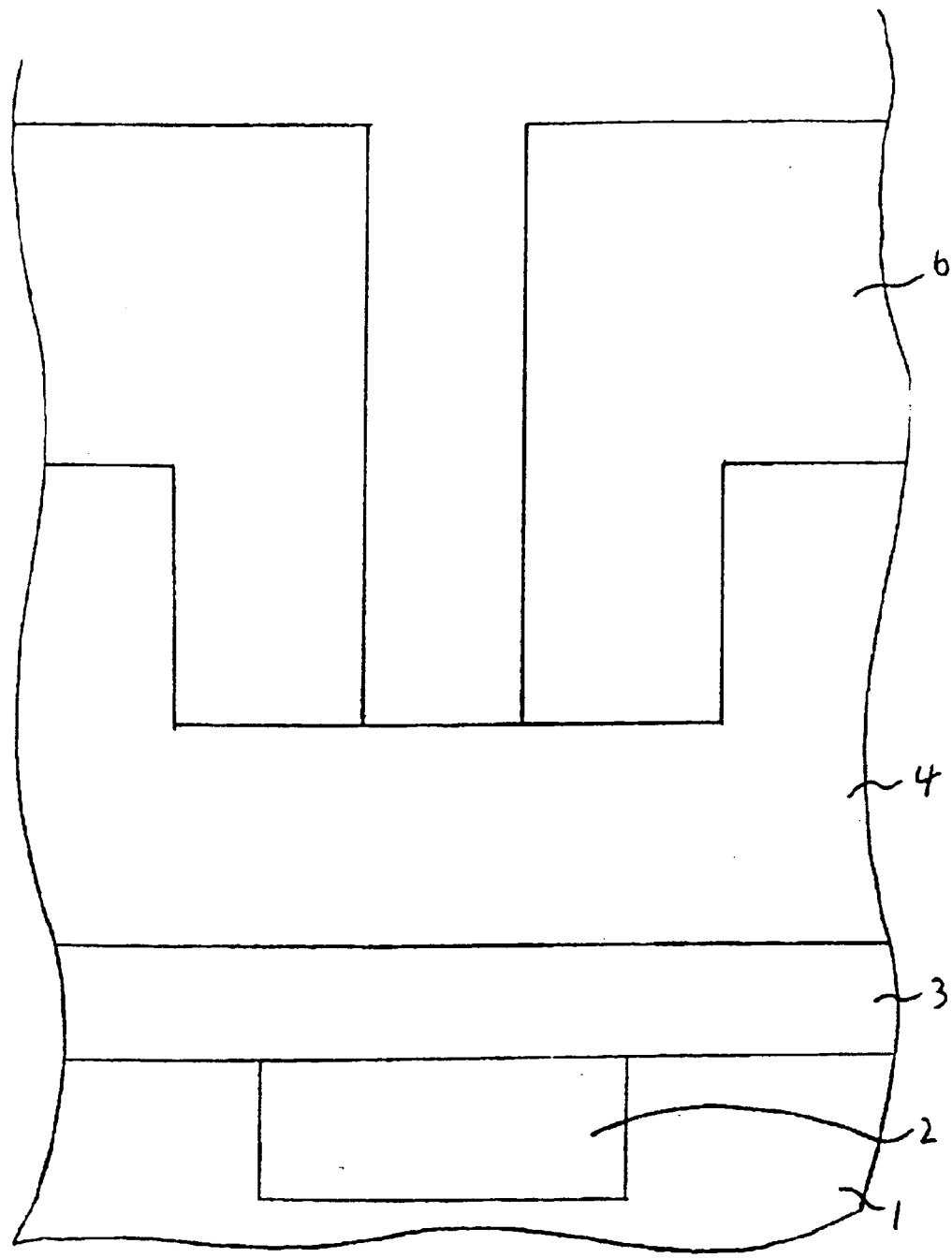
FIG. 3 is a diagram which shows a cross-sectional view of still another process of the dual damascene wiring technique of the prior art in progress.
Figure 4:
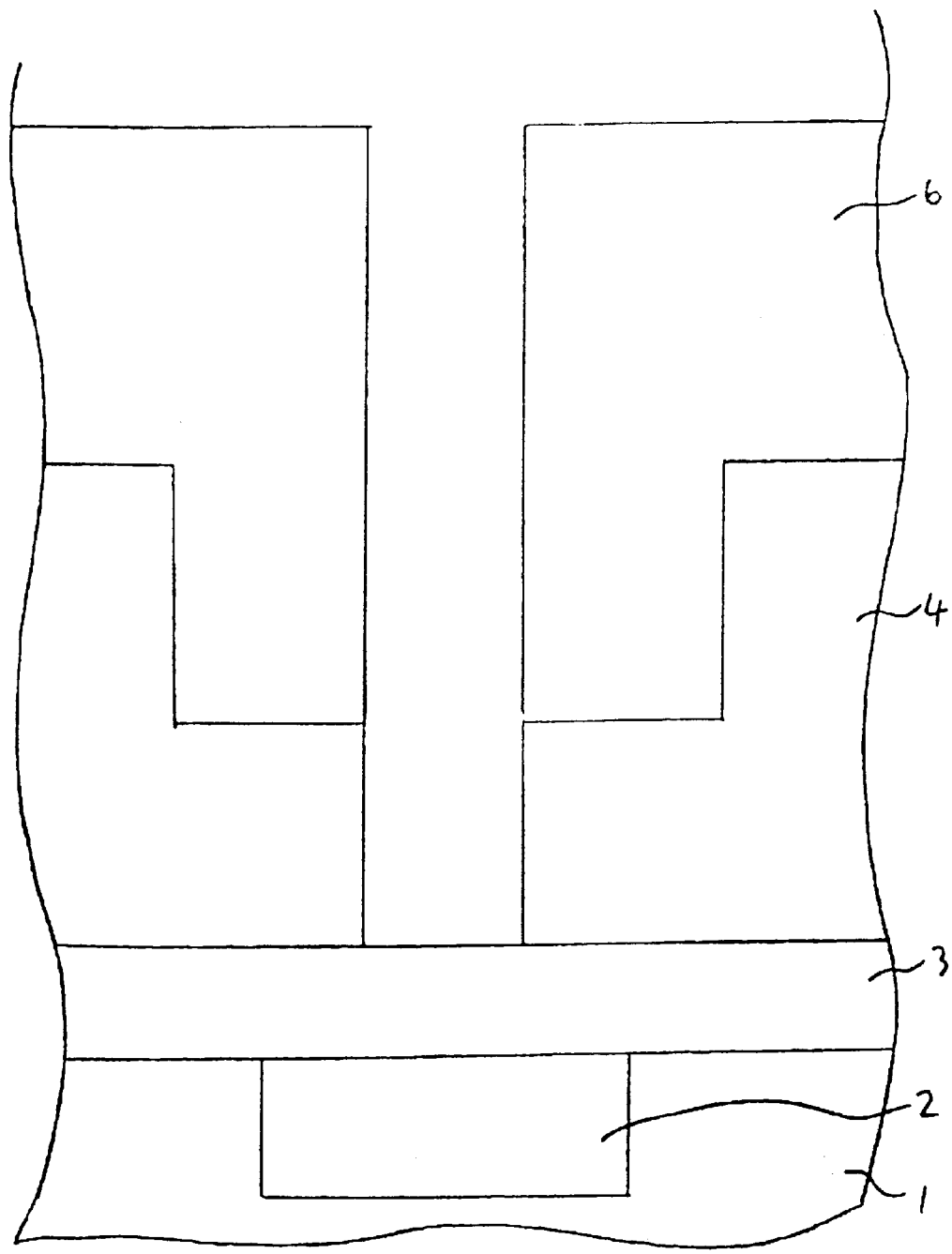
FIG. 4 is a diagram which shows a cross-sectional view of still another process of the dual damascene wiring technique of the prior art in progress.
Figure 5:
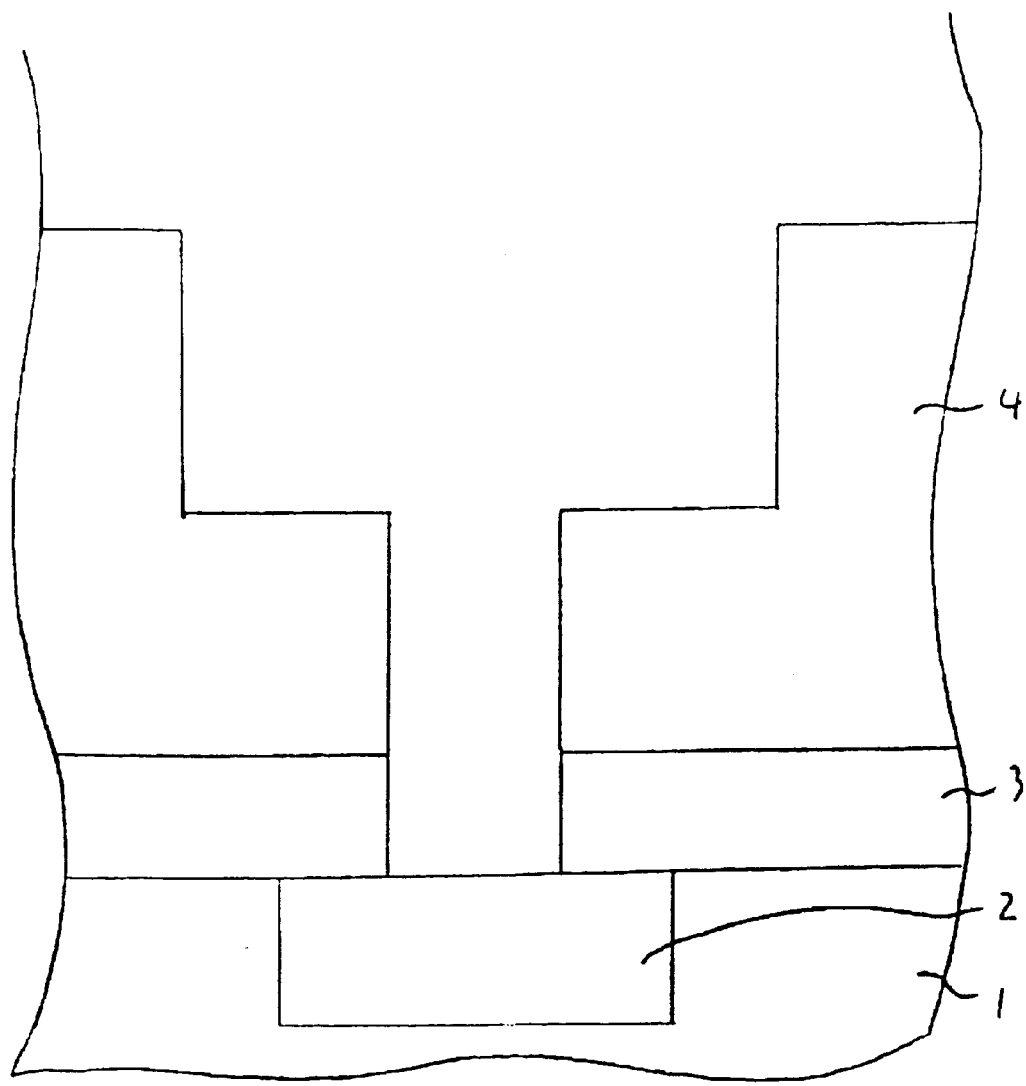
FIG. 5 is a diagram which shows a cross-sectional view of still another process of the dual damascene wiring technique of the prior art in progress.
Figure 6:
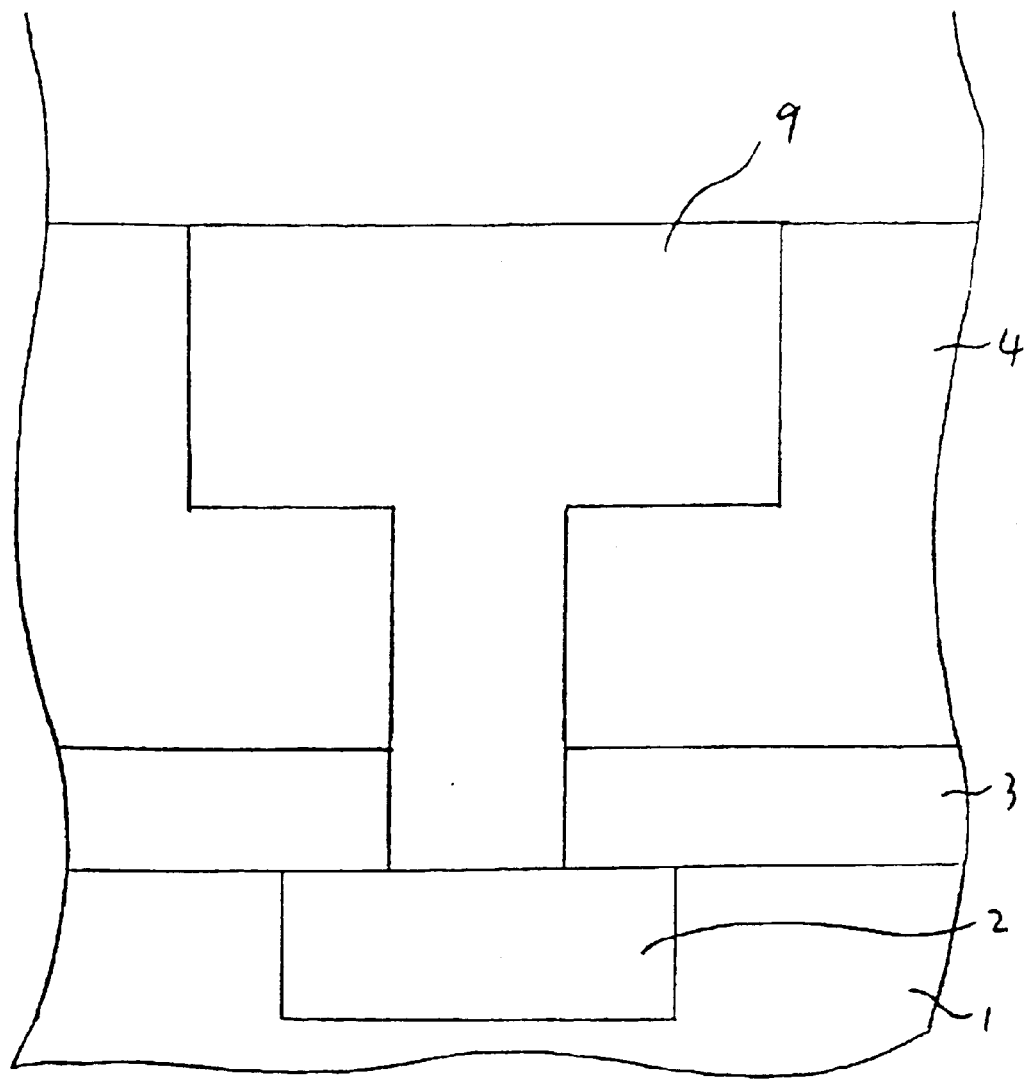
FIG. 6 is a diagram which shows a cross-sectional view of still another process of the dual damascene wiring technique of the prior art in progress.
Figure 7:
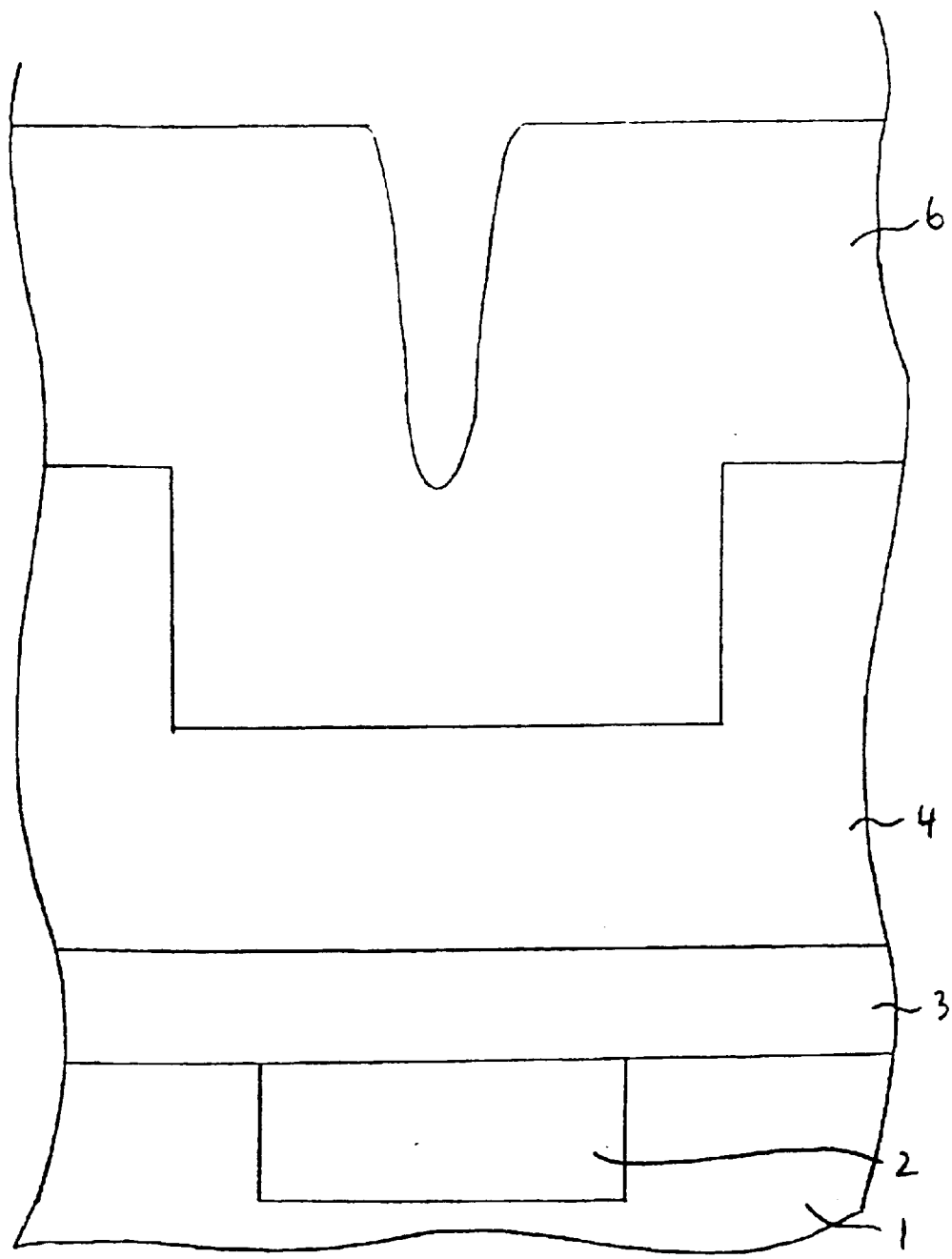
FIG. 7 is a diagram which shows a cross-sectional view of a process in progress and which points out the first problem of the prior art.
Figure 8:
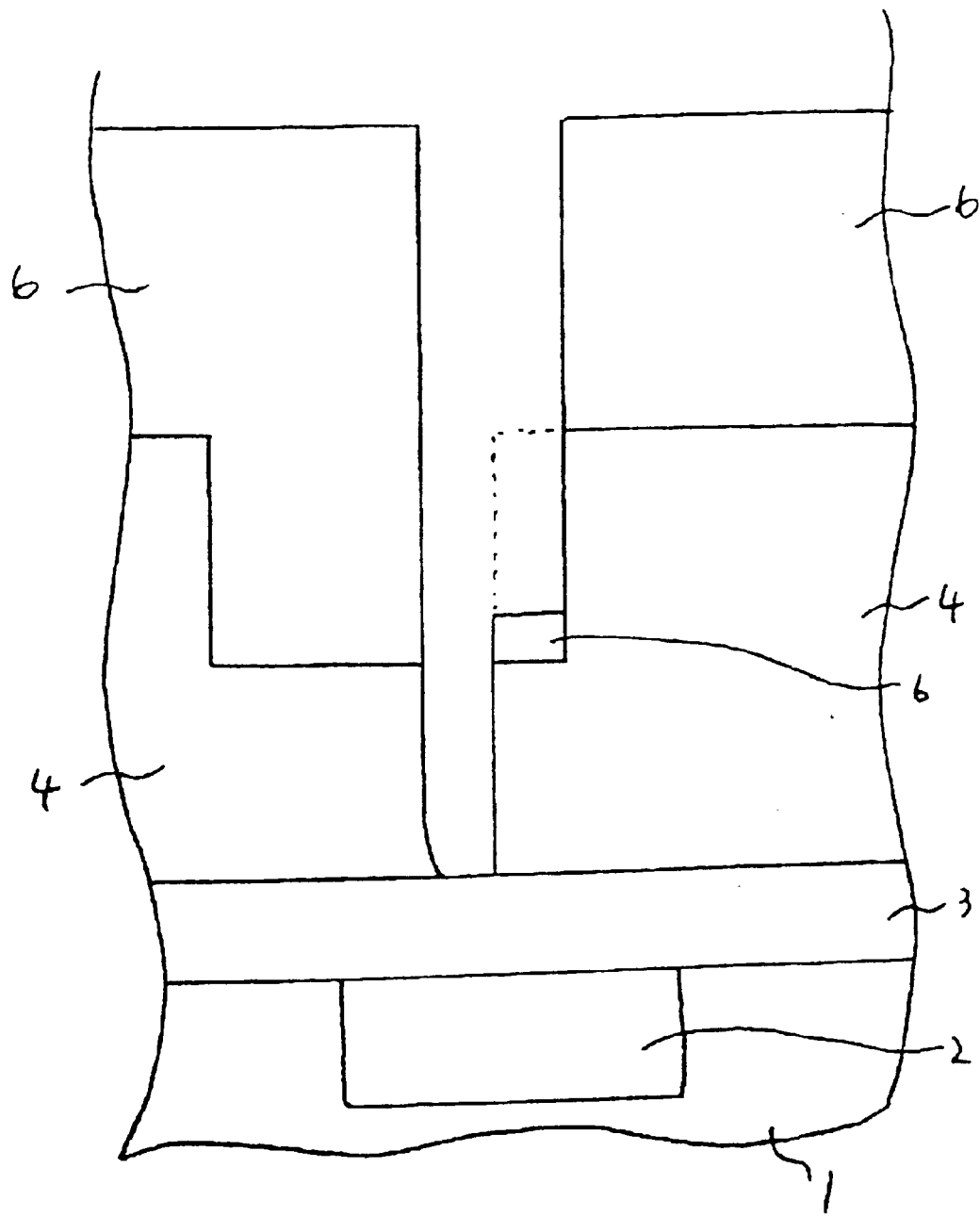
FIG. 8 is a diagram which shows a cross-sectional view of another process in progress and which points out the second problem of the prior art.
Figure 9:
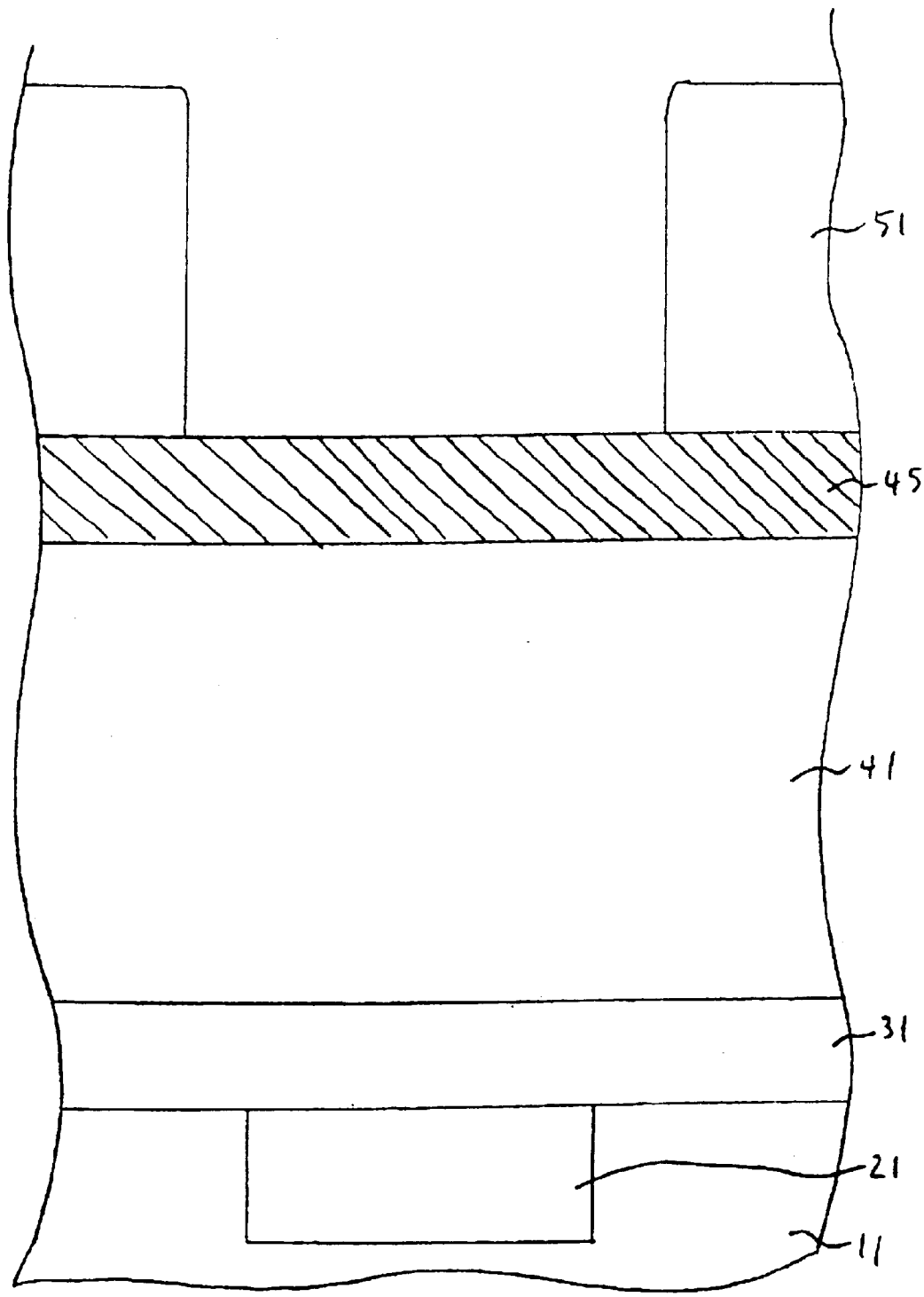
FIG. 9 is a diagram which shows a cross-sectional view of a process in progress with regard to the first embodiment of the present invention.

As shown in FIG. 9, the copper (Cu) wire layer (21) is formed patternwise within the lower interlayer insulating film (11), whereas the silicon nitride film (31) (500 Å), which serves as a protective film, is formed above it blanketwise based on the CVD (chemical vapor phase growth) method. Next, the silicon oxide film (41) (12,000 Å), which serves as an interlayer insulating film, and the silicon nitride film (45) (1,500 Å), which serves as an auxiliary film, are formed blanketwise. These blanketwise formation processes are preferably implemented based on the plasma CVD method, for in a case where the plasma CVD method is used, a high-density film can be formed, and the degree of difficulty of etching, namely the etching rate, can be easily adjusted depending on the film formation conditions. A photoresist (7,000 Å) is subsequently coated and formed on the silicon nitride film (45), followed by the configuration of a window on it based on a %well-known photolithographic method, as a result of which the resist mask (51) becomes finished, as FIG. 9 indicates.

A controlled etching operation is carried out by using the previously formned resist mask (51) in combination with an anisotropic dry etching device (gas etchant: $C_4F_8$/Ar/CO/$O_2$=5/100/100/10 sccm; source/bias=1,000/500 W; pressure: 40 mTorr; etching attributes: Etching rate of a silicon nitride film with a refractive index of 2.0=1,100 Å/min. and corresponding silicon oxide film rate=1,200 Å/min.; etching time=110 sec.). If the depth of the depression hereby formed as a result of etching is adjusted, the magnitude of the thickness necessary for the dual damascene wire structure (i.e., magnitude of the cross-sectional area of the dual damascene wire) can be adjusted.

A wire height=5,000 Å is designated in this example, whereas the thickness of the silicon nitride film in the depression formed as a result of etching (i.e., residual film) is designated at 500 Å. After the depression has been formed by means of dry etching, the resist is peeled. Well-known oxygenic plasma ashing methods may be used as peeling methods, and a surface chemical solution treatment simply needs to be additionally performed as a treatment which adventitiously follows the plasma ashing process.

Figure 10:
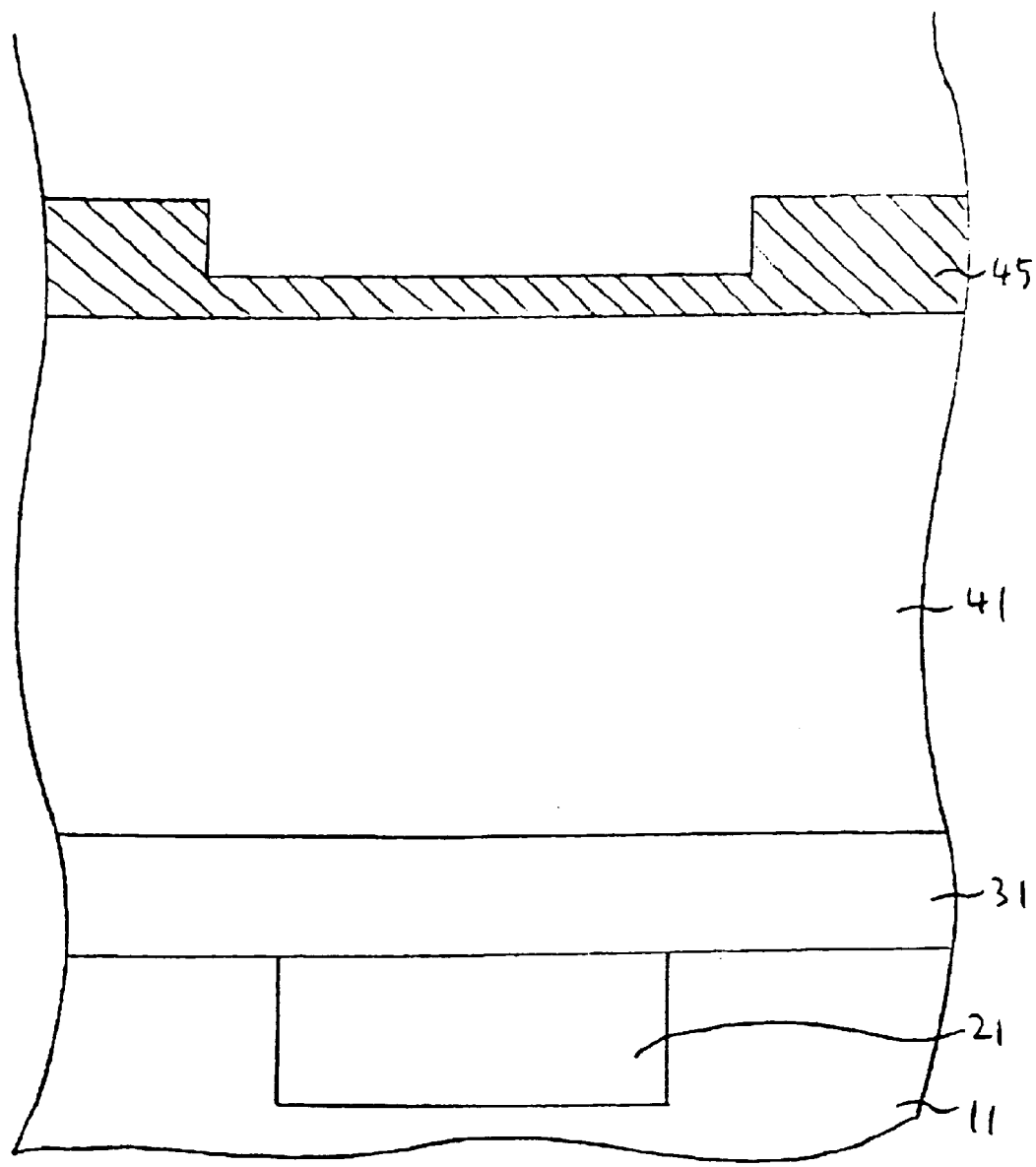
FIG. 10 is a diagram which shows a cross-sectional view of another process in progress with regard to the first embodiment of the present invention.
Figure 11:
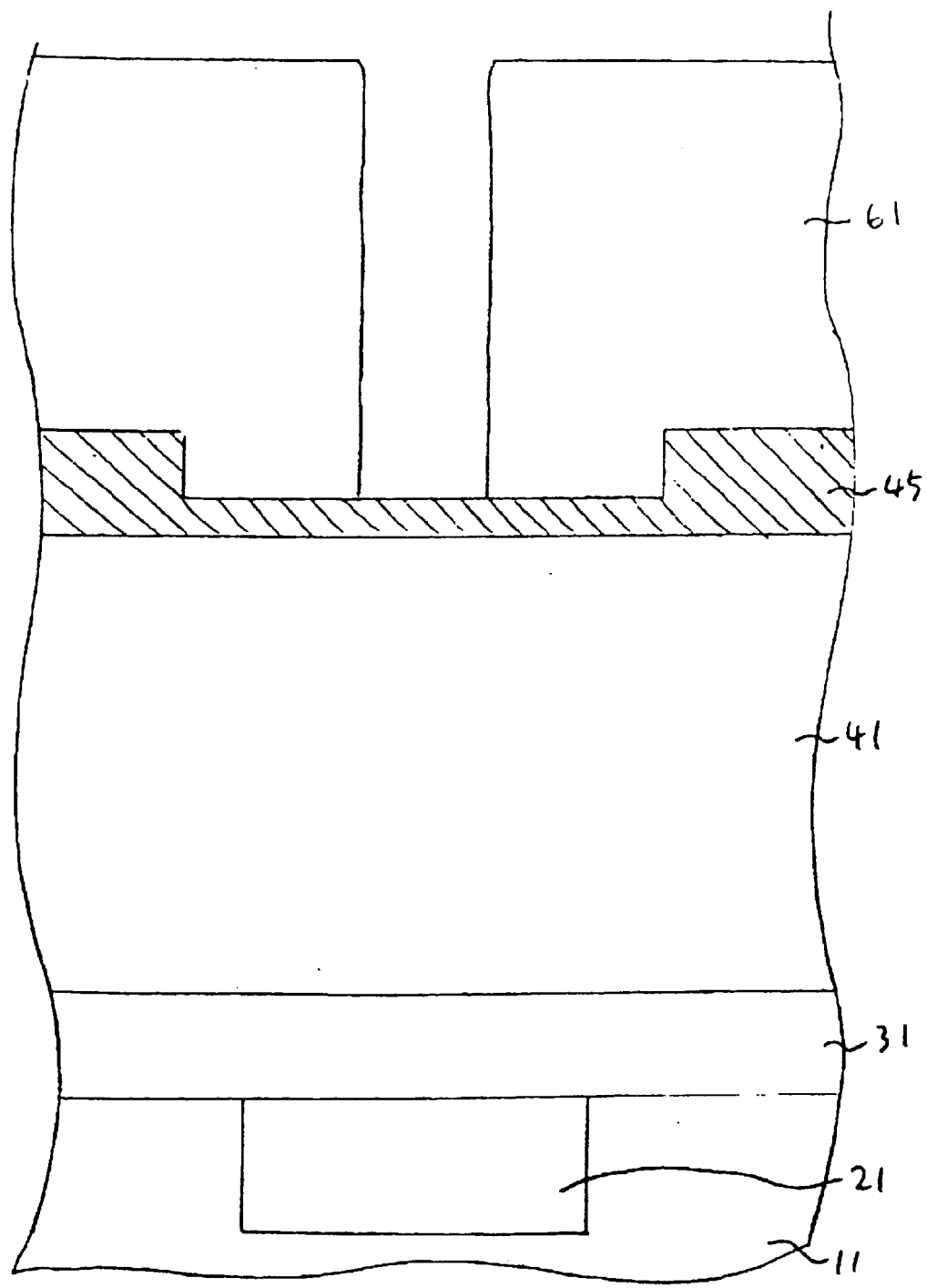
FIG. 11 is a diagram which shows a cross-sectional view of still another process in progress with regard to the first embodiment of the present invention.

The structure shown in FIG. 10 is obtained through the foregoing processes shown in FIG. 11.

Figure 12:
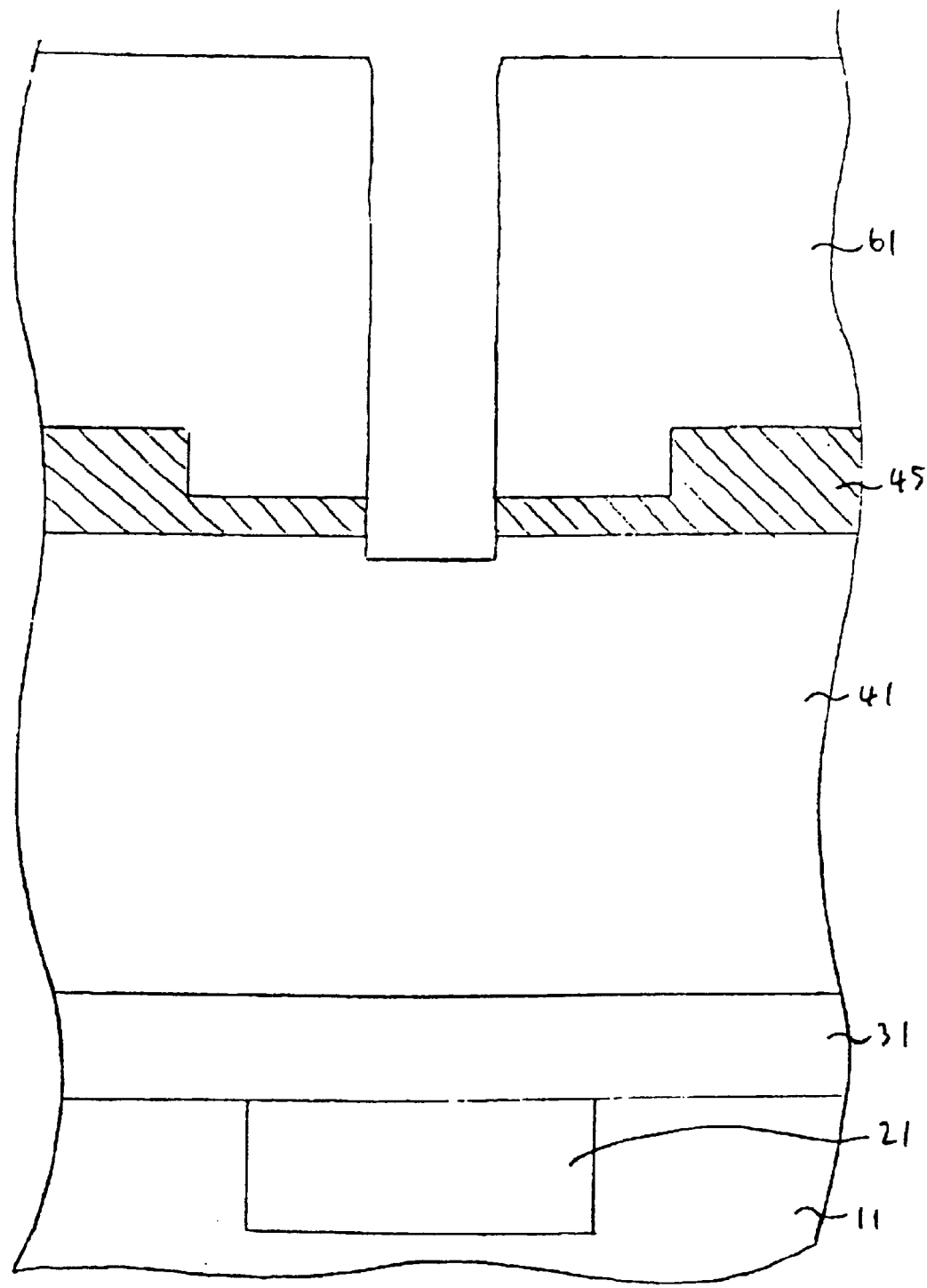
FIG. 12 is a diagram which shows a cross-sectional view of still another process in progress with regard to the first embodiment of the present invention.

Subsequently, another photoresist (61) is formed blanketwise over the entire plane of the silicon nitride film (45), including the depression. The photoresist is patterned based on a well-known photolithographic technique. The position at which the window is configured is hereby designated at the center of the depression in such a-way that it will not overlap the step differential of the depression of the silicon nitride film (45). In a case where the window is configured at the position, the initially etched silicon nitride film (45) does not acquire a step differential (i.e., thickness disparity) within the window, which is beneficial in that the etching control is accordingly facilitated, as shown in FIG. 12.

Figure 13:
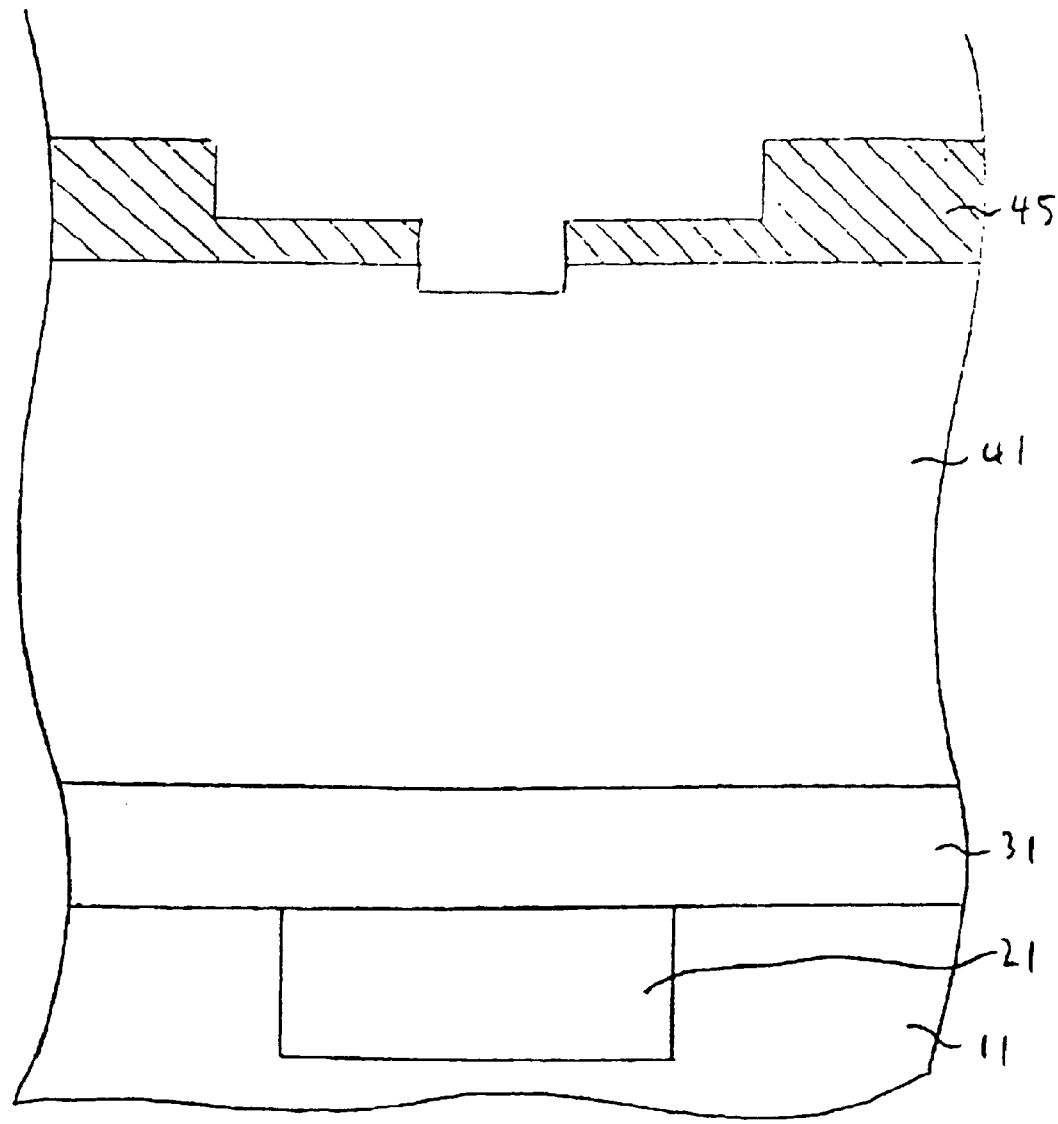
FIG. 13 is a diagram which shows a cross-sectional view of still another process in progress with regard to the first embodiment of the present invention.

Next, the silicon nitride film (45), which has been come to be bared to the bottom of the window, is etched and removed by using the resist mask (61), on which said window has been configured within the depression. This process may be implemented by using an anisotropic dry etching device, and the concomitant conditions are designated as follows: Gas etchant: $CHF_3$/$O_2$=25/8 sccm; bias conditions, namely source/bias=1,000/1,000 W; pressure: 25 mTorr; etching attributes: Silicon nitride film etching rate= 2,200 Å/min. and corresponding silicon oxide film rate=1,000 Å/min.; etching time=42 sec. In a case where this etching operation is terminated upon the detection of the baring of the silicon oxide film (41) which serves as a lower interlayer insulating film, the etching should be terminated in a well-controlled fashion. Next, the photoresist (61) is peeled and removed. Well-known oxygenic plasma ashing methods may be used as such methods, although it may be more preferable to perform a surface chemical solution treatment after the plasma ashing operation for the purpose of removing the residue, etc. The structure shown in FIG. 13 is thus obtained.

Figure 14:
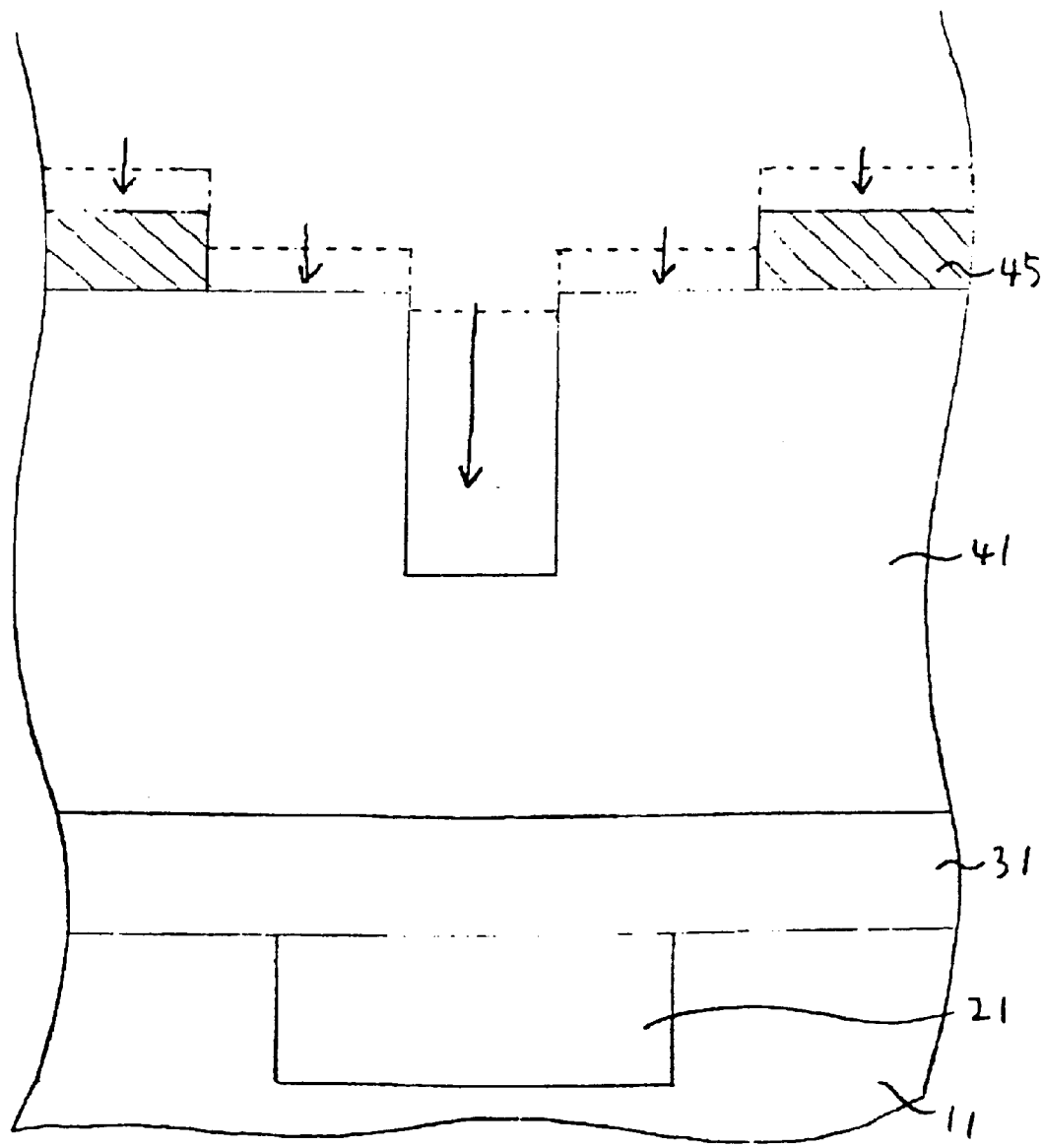
FIG. 14 is a diagram which shows a cross-sectional view of still another process in progress with regard to the first embodiment of the present invention.

The entire plane of the remaining structure is then subjected to an anisotropic dry etching operation while the silicon nitride film (45) is being used as a mask. The concomitant conditions are designated as follows: Gas etchant: $C_4F_8$/CO/Ar/$O_2$=10/75/200/5 sccm; bias conditions, namely source/bias=2,000/1,400 W; pressure: 40 mTorr; etching attributes: Silicon nitride film etching rate =580 Å/min. and corresponding silicon oxide film rate=7,000 Å/min; etching time=105 sec. During this etching) operation, the silicon oxide film (41), which prevails as an interlayer insulating film, becomes etched at a high rate while the silicon nitride film (45) is being concomitantly etched at a moderate rate. The etching period of this case is determined by the thickness of the film that constitutes the interlayer film, as shown in FIG. 14.

Figure 15:
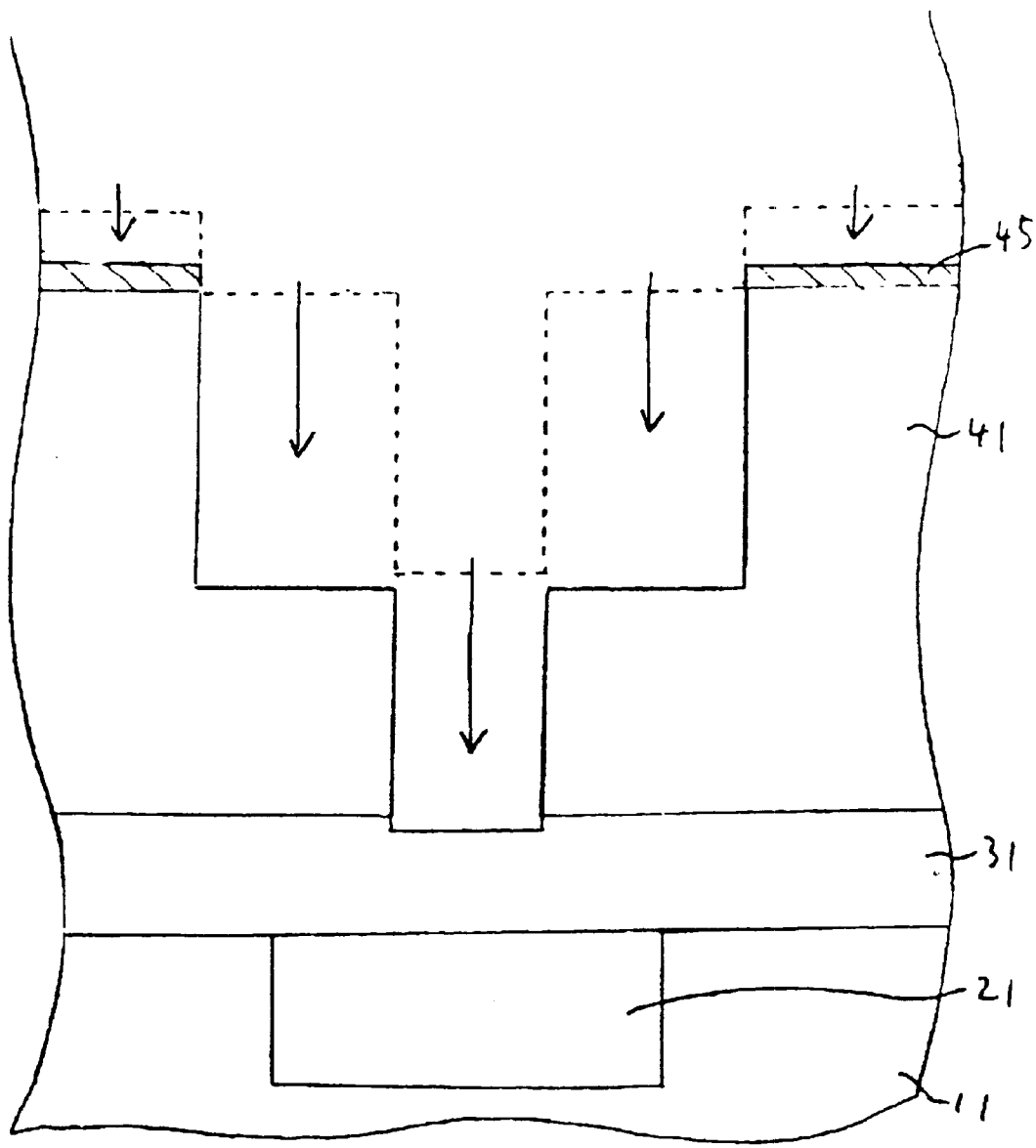
FIG. 15 is a diagram which shows a cross-sectional view of still another process in progress with regard to the first embodiment of the present invention.

The etching operation is carried out in this case in such a way that the thickness of the formed film will be 12,000 Å, and the control-etched auxiliary film becomes eradicated after an etching period of approximately 60 sec. under the aforementioned conditions, as a result of which the etching of the silicon oxide film becomes initialized. A channel pattern which is to become a wire layer is formed at a depth of approximately 5,250 Å in approximately 45 sec. (the thickness of the residual auxiliary film is approximately 450 Å), as shown in FIG. 15.

Figure 16:
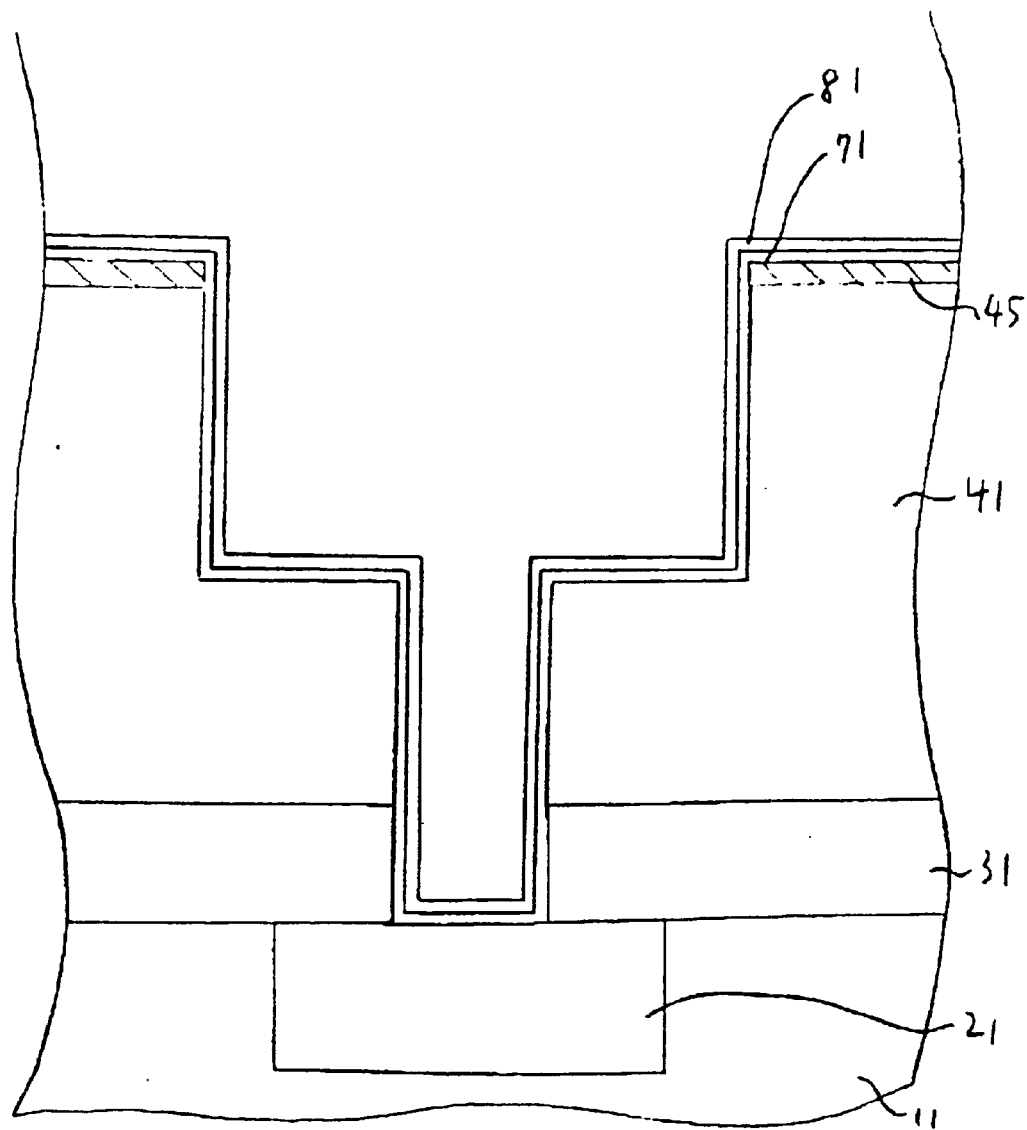
FIG. 16 is a diagram which shows a cross-sectional view of still another process in progress with regard to the first embodiment of the present invention.

An additional etching operation is then carried out by using an anisotropic dry etching apparatus. The concomitant conditions are designated as follows: Gas etchant: $CHF_3O_2$= 25/8 sccm; bias conditions, namely source/bias=1,000/1,000 W; pressure: 25 mTorr; etching attributes: Silicon nitride film etching rate=2,200 Å/min. and corresponding silicon oxide film rate=1,000 Å/min; etching time=20 sec. The etching period of this case is determined by the thickness of the film that constitutes the protective film (31). In this case, a film formation thickness of (500 Å+over 250 Å) is targeted. The etching operation is terminated at a stage where the silicon nitride film (31) underneath becomes bared to the bottom. The silicon nitride film (45) should remain at an indefinite thickness outside the dual damascene structure at this stage, and whether or not this silicon nitride film (45) should be removed depends on the structure of a device which is to be overlappingly formed above the remaining structure after the foregoing processes as well as on the required device performances. As far as mechanisms for removing it completely are concerned, a wet etching mechanism may be preferably used, although it can also be removed by means of dry etching. In a case where it is completely removed, a high-permittivity silicon nitride film in effect becomes removed from the wire interlayer space, based on which the parasitic capacitance between wire layers, which is a factor that hinders high-speed actions, can be minimized. In the case of a technical field, wherein a high action speed is emphasized as a decisive factor that determines the value of a commercial product, as in the case of a logic device, it would be feasible either to remove the silicon nitride film (45) or to use a material the permittivity of which is relatively low and the etching rate of which is lower than that of the silicon oxide film (41) in place of the silicon nitride film (45), as shown in FIG. 16.

Figure 17:
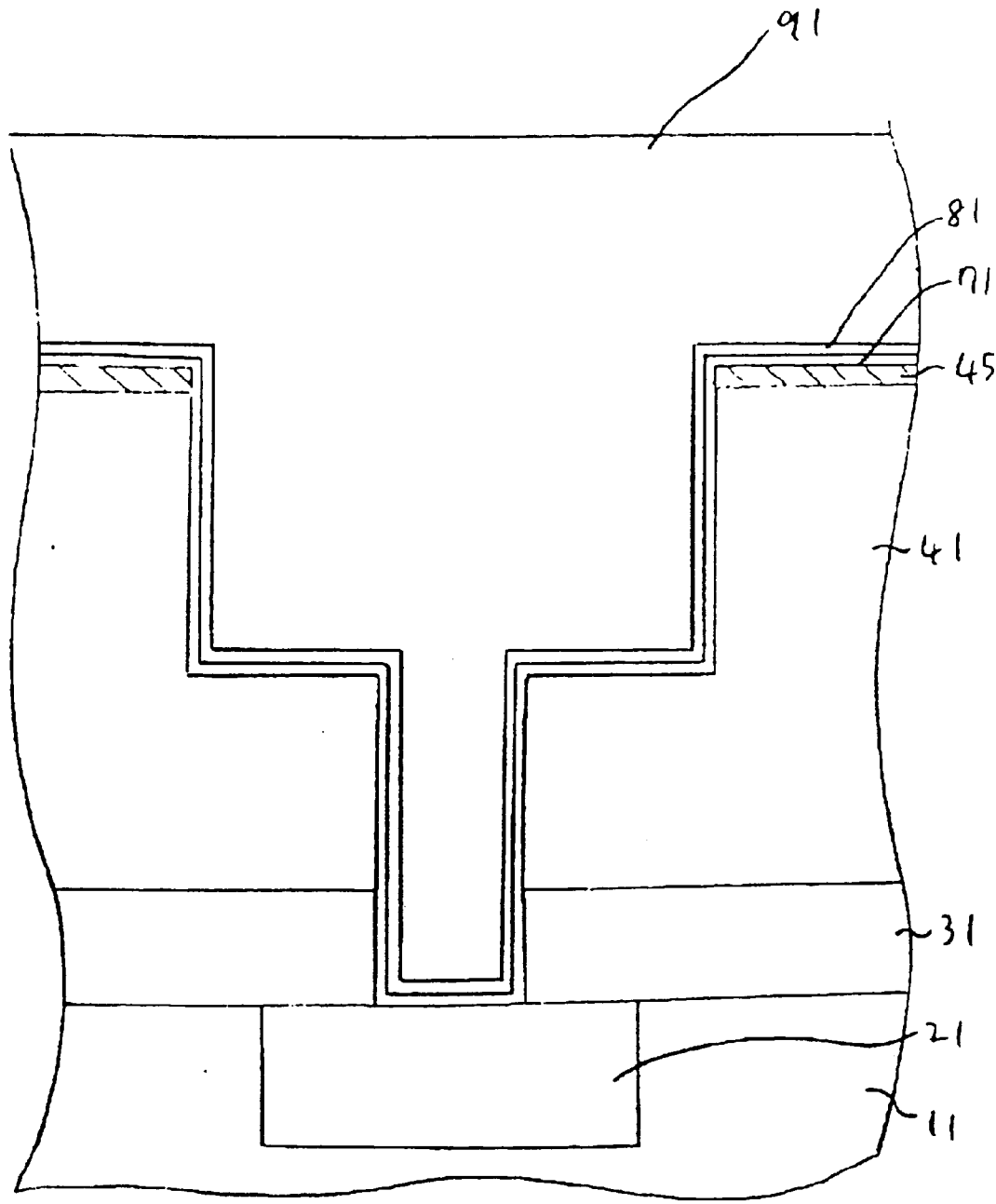
FIG. 17 is a diagram which shows a cross-sectional view of still another process in progress with regard to the first embodiment of the present invention.

During the subsequent process, the silicon nitride layer underneath is first etched and removed, as a result of which the surface of the copper (Cu) wire layer (21) becomes bared to the bottom of the window. A copper (Cu) wire layer is formed on the remaining structure obtained as a result of the foregoing processes (dual damascene window). First, the tantalum nitride (TaN) film (71) (500 Å) is formed thinly by means of sputtering, and next, the copper (Cu) seed layer (81) (1,000 Å) is formed thinly by means of sputtering. The tantalum nitride (TaN) serves the function of barrier layer which prevents the thermal diffusion of copper (Cu) toward the silicon oxide film (41), and this tantalum nitride (TaN) may be safely substituted with an electroconductive film which includes a high-melting-point metal other than the tantalum nitride (TaN), as shown in FIG. 17.

Next, the copper (Cu) layer (91) is formed thickly based on the plating method by using the copper (Cu) seed layer (81). The thickness of the layer hereby formed must be large enough for the portion which has filled the dual damascene window to bulge from the window, as shown in FIG. 18.

The copper (Cu) layer (91) is then etched back based on the CMP (chemicomechanical polish) method, and the extraneous copper (Cu) layer (91) outside the dual damascene window is then removed, as a result of which a copper (Cu) dual damascene wire structure becomes finished. Prior to the filmwise formation of the wire material, the bared copper (Cu) layer (91) surface is washed by means of a chemical solution treatment. Such a washing operation may be carried out based on a general chemical solution treatment method.

Even in a case where a silicon oxynitride film silicon carbide film is employed as the silicon nitride film (31), which is configured underneath the silicon oxide film (41), too, a similar shape can be obtained. Moreover, a similar structure can be obtained by using a fluorine-added silicon oxide film as the silicon oxide film (41). In the case of an organic compound or porous compound, moreover, a similar shape can be obtained by configuring a thin silicon nitride film on a film which has been formed by using it. In a case where a silicon oxynitride film silicon carbide film is employed as the silicon nitride film (45), too, a similar shape can be obtained. The film formation can be further facilitated in a case where the optical constant of the silicon nitride film (45) is optimal for patterning and where its etching resistance is excellent. In a case where the silicon nitride film (45) is constituted by two or more types of materials (e.g., where a silicon nitride film with a high refractive index and a silicon nitride film with a low refractive index are used in combination), furthermore, the wire depth can be controlled more easily. Generally speaking, the etch rate is low in a case where the refractive index is high, whereas the etch rate tends to increase as the refractive index decreases. Even in cases where metals (e.g., gold, silver, tungsten, aluminum, titanium, tantalum, molybdenum, etc.) or metal compounds (e.g., aluminum-copper, titanium nitride, tantalum nitride, tungsten nitride, molybdenum nitride, etc.) are used, too, similar shapes can be obtained.

Figure 19:
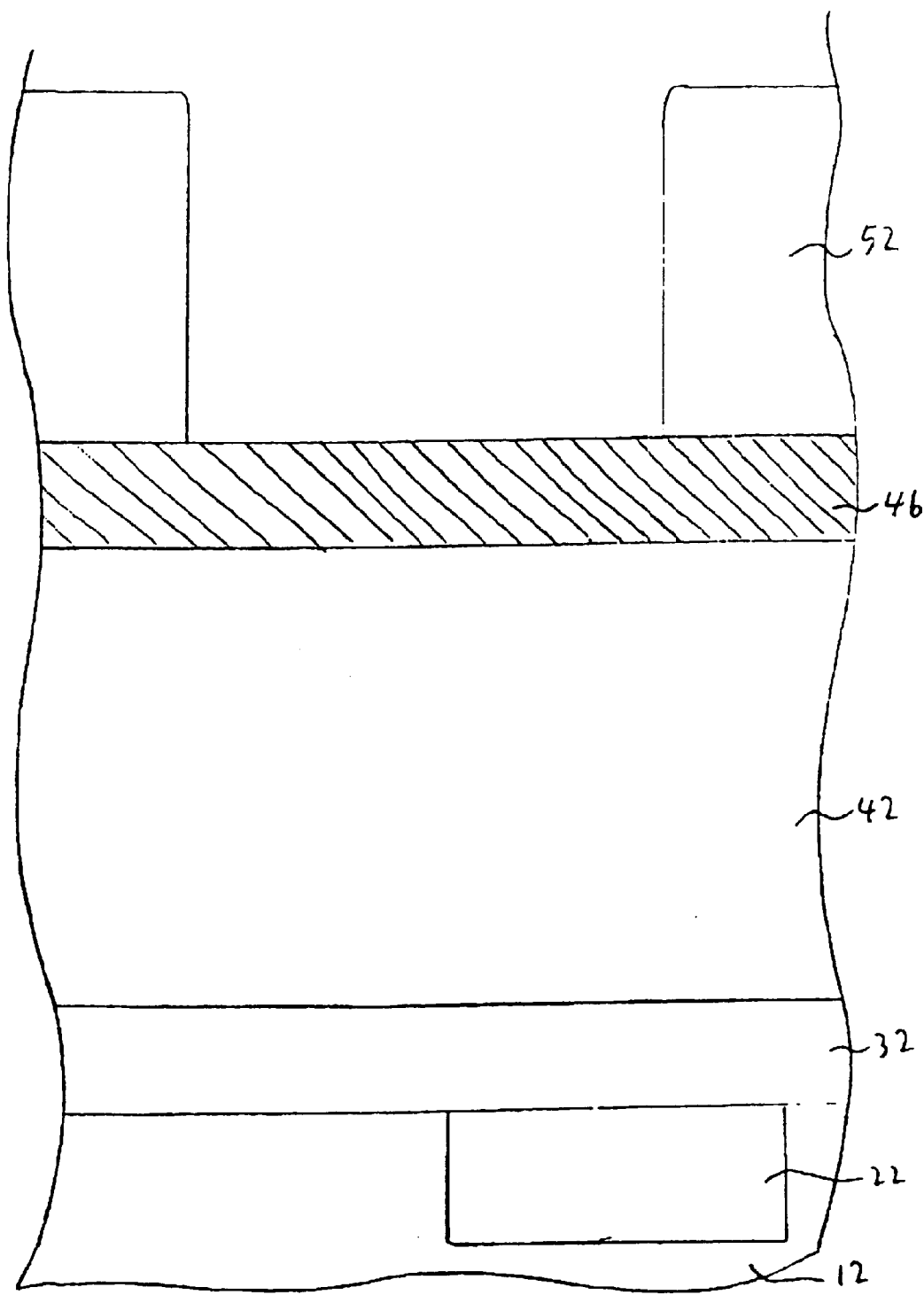
FIG. 19 is a diagram which shows a cross-sectional view of a process in progress with regard to the second embodiment of the present invention.

FIGS. 19 through 27 are diagrams which show the respective processes of the second embodiment according to the present invention. The second embodiment, which will be explained below, is similar to the first embodiment in the senses that a coating film on which a depression has been formed is configured above an interlayer insulating film on which a dual damascene wire structure is scheduled to be configured and that it is used for etching back purposes. The second embodiment, however, differs from the first embodiment, in which a small opening is configured at the center of the depression which has been configured on the coating film, in the sense that a resist patterning operation is carried out while the opening is being designed to overlap the fringe of the depression, namely the step differential segment. Despite the fact that a smaller window is configured within a preliminarily configured depression, the opening of the resist mask used for opening a small window is rather large and favorable in this case, and therefore, a small window can be opened even in a situation where it is difficult to open a small window due to photolithographic limitations (e.g., resolution, etc.), which is in turn beneficial in that size reduction and advanced integration effects which transcend the limitations of the photolithographic performances can be ensured for the entire device, as shown in FIG. 19.

The copper (Cu) wire layer (22) is formed patternwise within the lower interlayer insulating film (12), whereas the silicon nitride film (32) (500 Å) is formed blanketwise above it as a protective film based on the CVD (chemical vapor-phase growth) method. The silicon oxide film (42) (12,000 Å), which serves as an interlayer insulating film, and the silicon nitride film (46) (1,500 Å), which serves as an auxiliary layer, are further formed in proper order blanketwise. These films can be favorably formed blanketwise based on the plasma CVD method. In a case where the plasma CVD method is employed, a high-density film can be formed, and the rate, namely the degree of difficulty of etching, can be easily adjusted depending on the film formation conditions. The film formation conditions can be redesignated by simply redesignating process parameters. In a case where a film constituted by two layers with mutually different etching rates is formed in place of the single-layer silicon nitride film (46), therefore, it is desirable for both of these films to be formed based on the plasma CVD method. Even if both films that respectively constitute the two layers are constituted by silicon nitride films in such a case, a depression can be formed in a highly controllable fashion in a case where their respective compositions are rendered different by switching the film formation conditions midway and where an etch stopper function of lowering the etching rate vis-a-vis the base underneath is thereby assumed, based on which a dual damascene structure which protrudes downward can be formed in a highly controllable fashion by forming and transferring a pattern to the interlayer insulating film underneath. Thus, this technique may be said to be suitable for mass production purposes. In a case where the double-layer film is thus formed based on the plasma CVD method, there is no need to remove the substrate from a plasma CVD (chemical vapor-phase growth) chamber in the midst of a double-layer film formation process. Since the film can be continuously formed without being bared to the outer atmosphere, the pervasions of impurities on the interface of the double-layer film can be avoided, which, too, is desirable. In a case where such a double-layer film is constituted, the conditions for forming the silicon nitride film that constitutes the first layer may, for example, be designated as follows: $SiH_4/NH_3/N_2=260/240/900$ sccm; RF power=120 W; pressure: 2.5 Torr, under which a film the refractive index of which is approximately 2.3 is formed, whereas the conditions for forming the silicon nitride film that constitutes the second layer may be designated as follows: $SiH_4/NH_3/N_2$ 75/35/2,500 sccm; RF power=370 W; pressure: 4.0 Torr, under which a film the refractive index of which is approximately 2.0 is formed.

Subsequently, a photoresist (7,000 Å) is formed and coated on the silicon nitride film (46) illustrated in the figure, which consists of such a double-layer film or an equivalent substitute, and a window is then configured based on a well-known photolithographic technique, as a result of which the resist mask (52) is formed, as FIG. 19 indicates.

Figure 20:
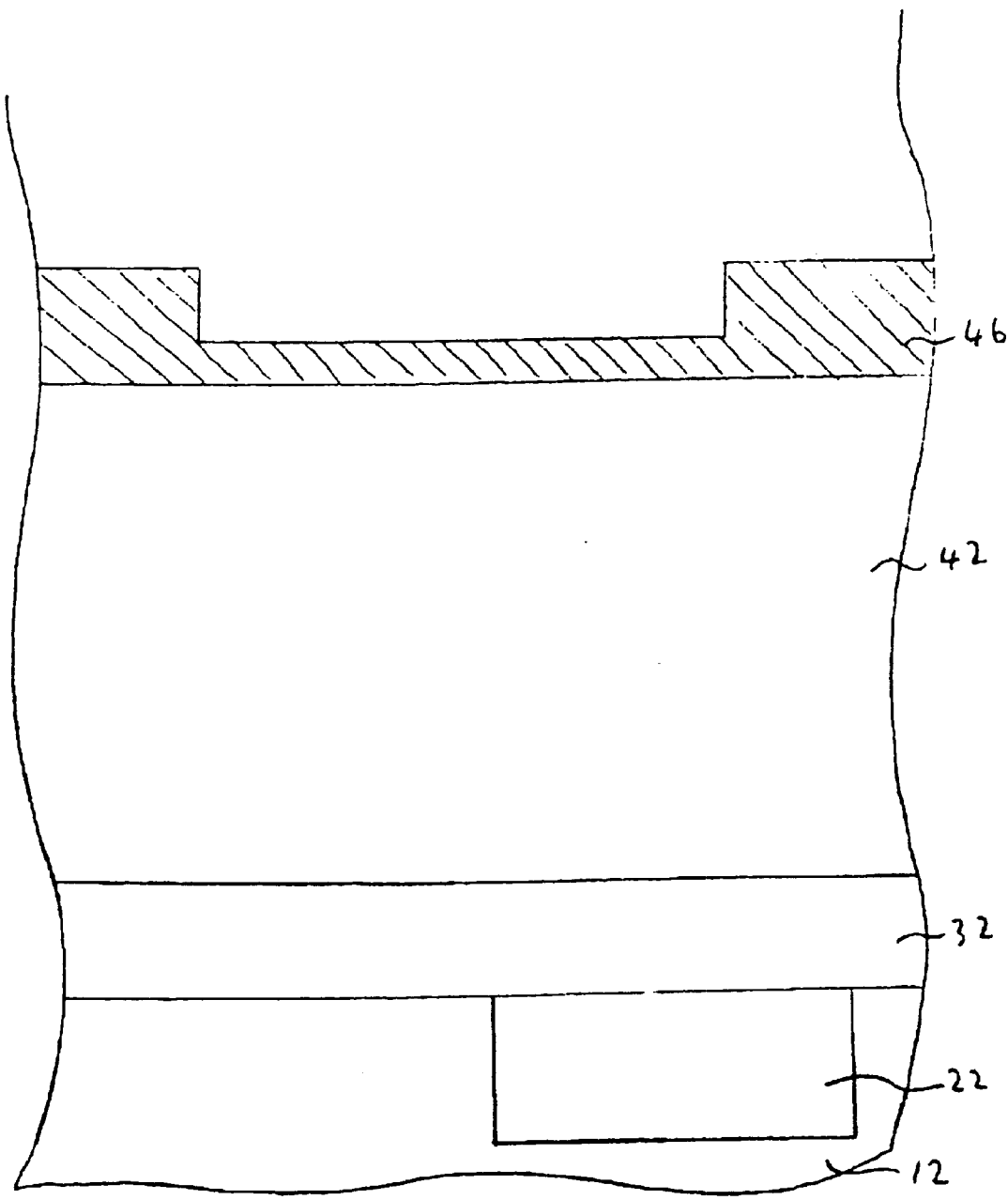
FIG. 20 is a diagram which shows a cross-sectional view of another process in progress with regard to the second embodiment of the present invention.

A controlled etching (half etching) operation is carried out by using the resist mask (52) thus formed in combination with an anisotropic dry etching device (gas etchant: $CHF_3/O_2$=25/8 sccm; bias conditions, namely source/bias=1,000/1,000 W; pressure: 25 mTorr; etching attributes: Silicon nitride film etching rate=2,200 Å/min. and corresponding silicon oxide film rate=1,000 Å/min.; etching time 28 sec.). If the depth of the depression hereby formed as a result of etching is adjusted, the magnitude of the thickness necessary for the dual damascene wire structure (i.e., magnitude of the cross-sectional area of the dual damascene wire) can be adjusted. A wire height=5,000 Å is designated in this example, whereas the thickness of the silicon nitride film in the depression formed as a result of etching (i.e., residual film) is designated at 500 Å, as shown in FIG. 20.

Figure 21:
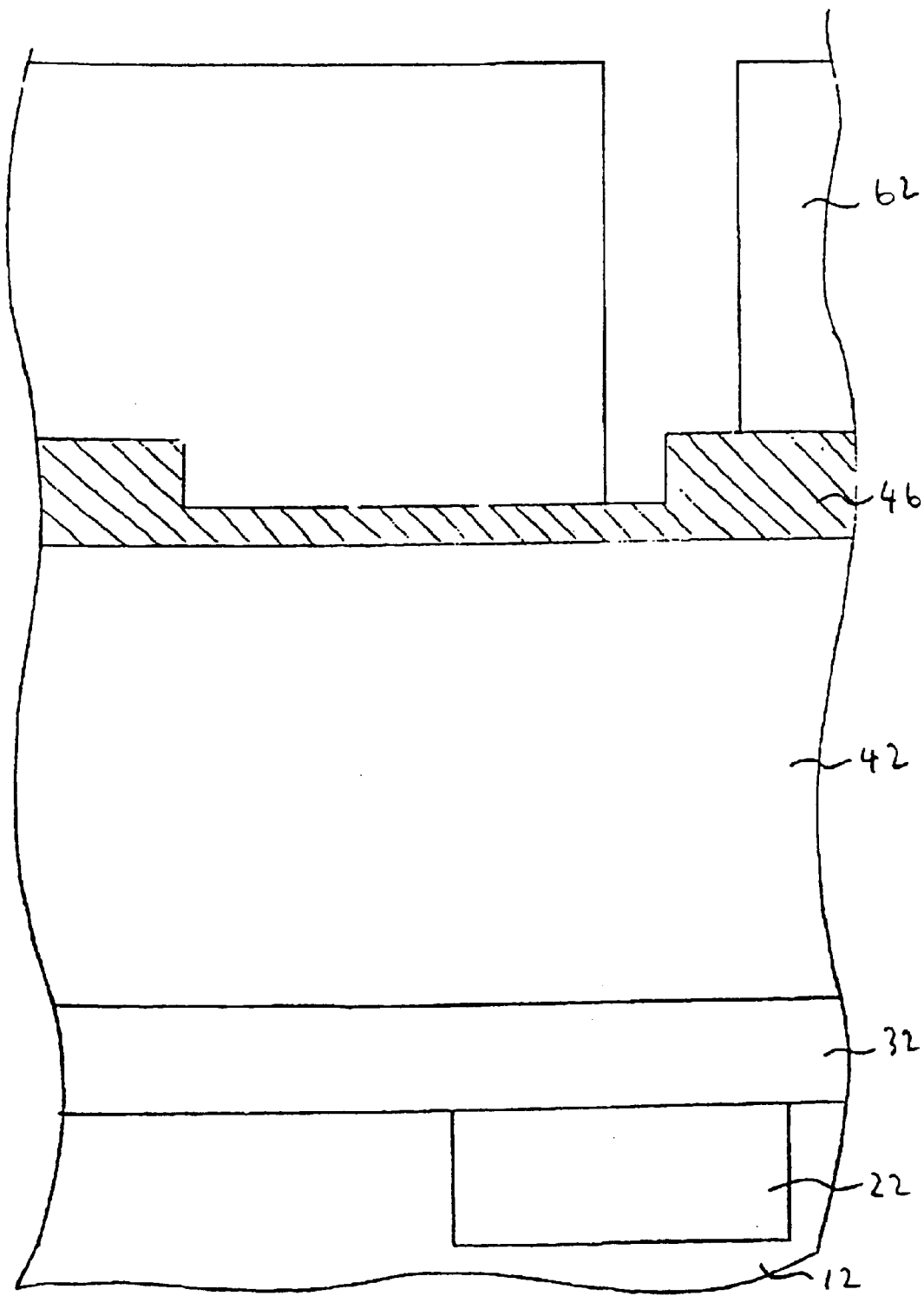
FIG. 21 is a diagram which shows a cross-sectional view of still another process in progress with regard to the second embodiment of the present invention.

After the depression has been formed by means of dry etching, the resist is peeled. Well-known oxygenic plasma ashing methods may be used as peeling methods, and a surface chemical solution treatment simply needs to be additionally performed as a treatment which adventitiously follows the plasma ashing process, as shown in FIG. 21.

Figure 22:
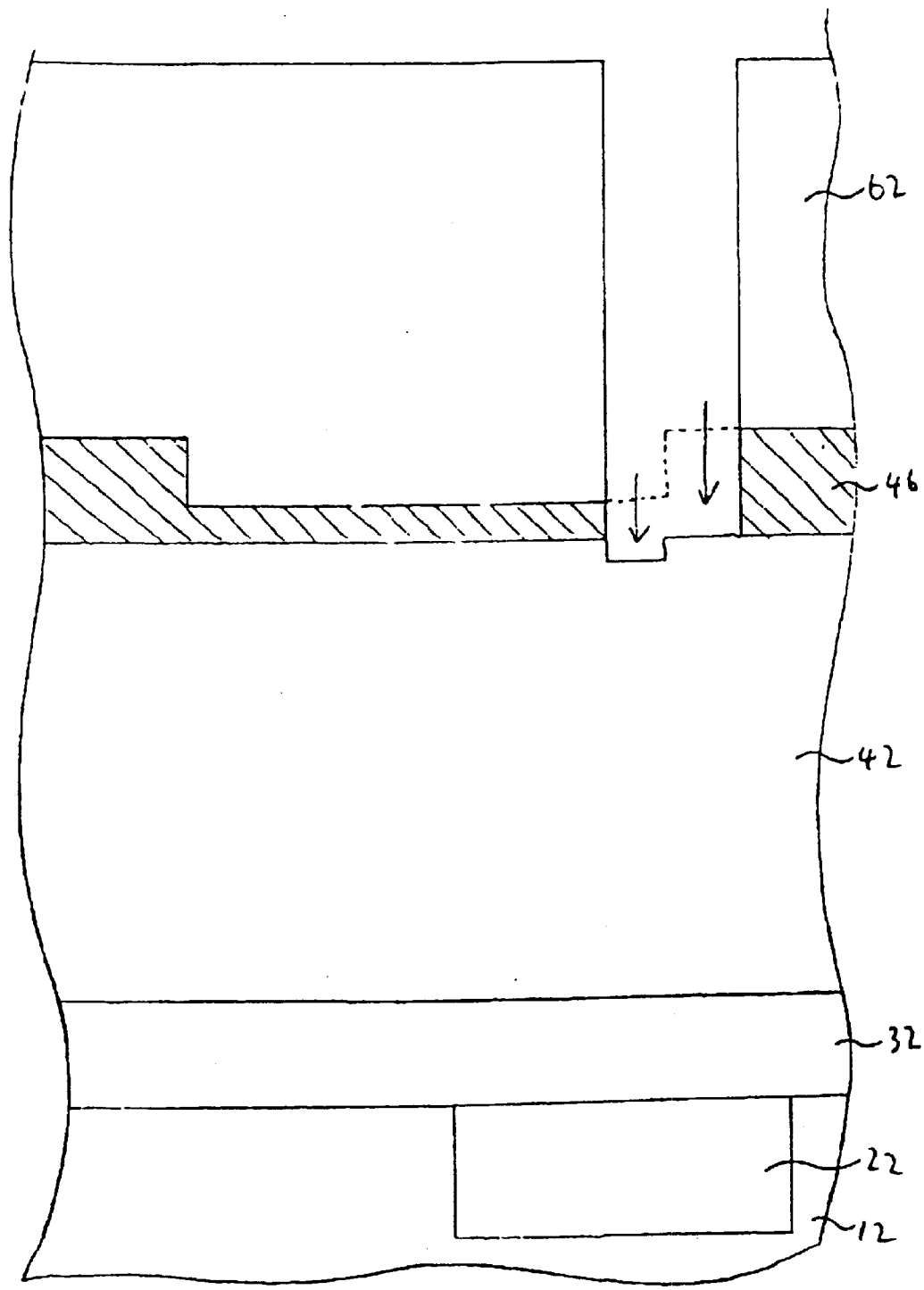
FIG. 22 is a diagram which shows a cross-sectional view of still another process in progress with regard to the second embodiment of the present invention.

Subsequently, another photoresist (62) is formed blanketwise over the entire plane of the silicon nitride film (46), including the depression. The photoresist is patterned based on a well-known photolithographic technique. The position at which the window is configured is hereby designated intentionally to overlap the step differential of the depression of the silicon nitride film (46). In a case where the window is configured at such a position, it is beneficial in that a small window can be opened by using a rather large mask window. In other words, an effect of cleanly opening a small window can be achieved even in a case where the opening size of the resist mask (62) cannot be reduced due to photolithographic performance limitations, as shown in FIG. 22.

Figure 23:
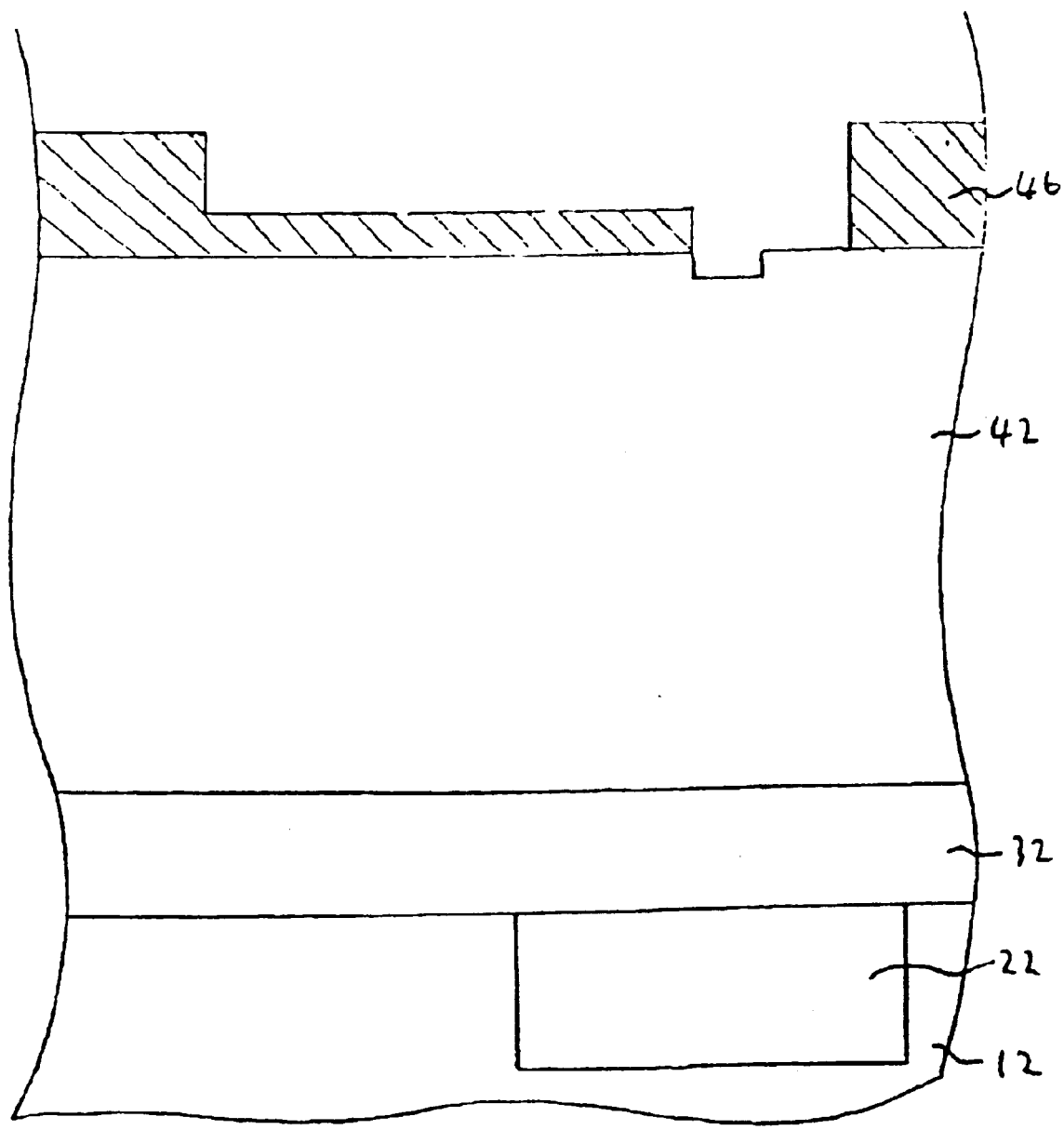
FIG. 23 is a diagram which shows a cross-sectional view of still another process in progress with regard to the second embodiment of the present invention.

The silicon nitride film (46), which has thus come to be bared to the bottom of the window, is first etched and removed by using the photoresist (62), on which a window which overlaps the depression step differential has been configured. This process may be implemented by using an anisotropic dry etching device, and the concomitant conditions may, for example, be designated as follows: Etchant gas: $CHF_3/O_2$=25/8 sccm; bias conditions, namely source/bias=1,000/1,000 W; pressure: 25 mTorr; etching attributes: Silicon nitride film etching rate=2,200 Å/min. and corresponding silicon oxide film rate=1,000 Å/min.; etching time=42 sec. In a case where the etching operation is hereby terminated at a stage where the silicon oxide film (42), which serves as a lower interlayer insulating film, has become bared, the etching should be terminated in a highly controllable fashion, as shown in FIG. 23.

Figure 24:
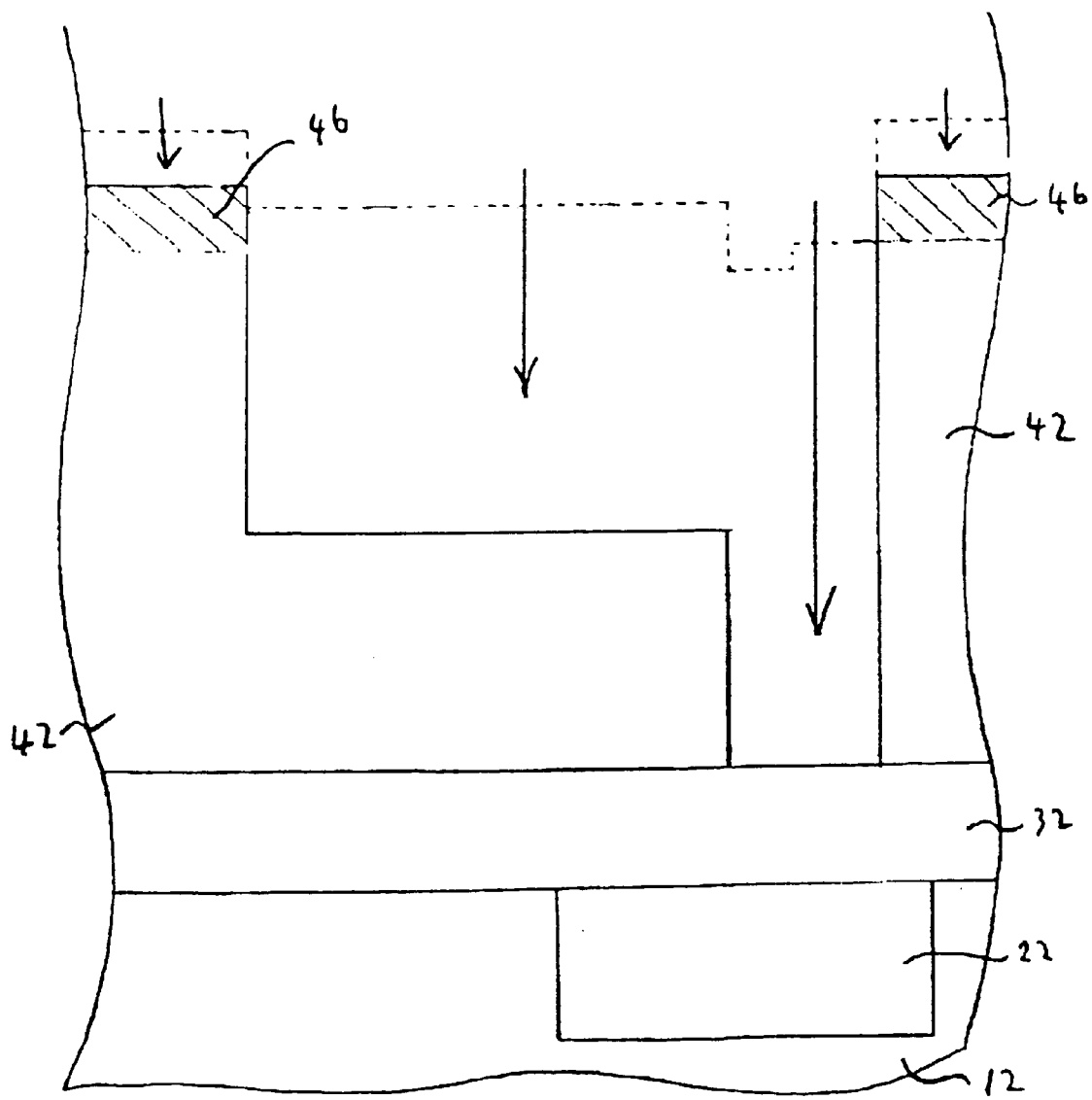
FIG. 24 is a diagram which shows a cross-sectional view of still another process in progress with regard to the second embodiment of the present invention.

Next, the photoresist (62) is peeled and removed. Well-known oxygenic plasma ashing methods may be used as peeling methods, although it may be more preferable to perform a surface chemical solution treatment after the plasma ashing operation for the purpose of removing the residue, etc., as shown in FIG. 24.

Subsequently, the entire plane of the remaining structure is subjected to an anisotropic dry etching operation while the silicon nitride film (46) is being employed as a mask. The concomitant etching conditions are designated as follows: Etchant gas: $C_4F_8/CO/Ar/O_2$=10/75/200/5 sccm; bias conditions, namely source/bias=2,000/1,400 W; pressure: 40 mTorr; etching attributes: Silicon nitride film etching rate= 580 Å/min. and corresponding silicon oxide film rate=7,000 Å/min.; etching time=115 sec. During this etching operation, the silicon oxide film (42), which prevails as an interlayer insulating film, becomes etched at a high rate while the silicon nitride film (46) is being concomitantly etched at a moderate rate. The etching period of this case is determined by the thickness of the film that constitutes the interlayer film. In this case, the etching is induced to progress in such a way that a film with a thickness of 12,000 Å will be formed, and the control-etched auxiliary film becomes eradicated after an etching period of approximately 70 sec. under the aforementioned conditions, as a result of which the etching of the silicon oxide film becomes initialized. A channel pattern which is to become a wire layer is formed at a depth of approximately 5,250 Å in approximately 45 sec. (the thickness of the residual auxiliary film is approximately 400 Å).

Figure 25:
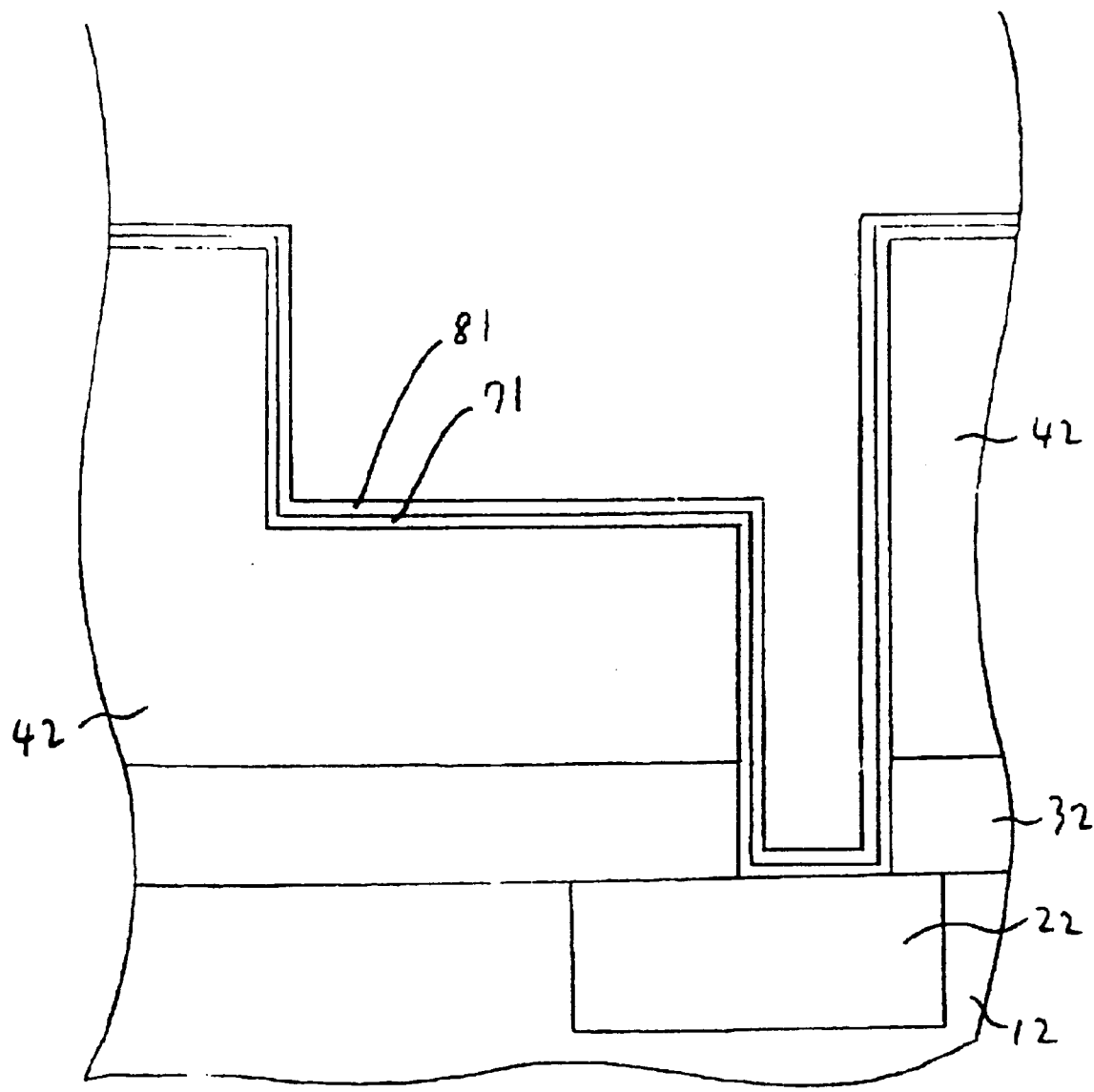
FIG. 25 is a diagram which shows a cross-sectional view of still another process in progress with regard to the second embodiment of the present invention.

An additional etching operation is carried out by using an anisotropic dry etching device. The concomitant etching conditions are designated as follows: Etchant gas: $CHF_3/O_2$=25/8 sccm; bias conditions, namely source/bias=1,000/1,000 W; pressure: 25 mTorr; etching attributes: Silicon nitride film etching rate=2,200 Å/min. and corresponding silicon oxide film rate=1,000 Å/min.; etching time=20 sec. The etching period of this case is determined by the thickness of the concomitantly formed protective film (32). In this case, a film formation thickness of (500 Å+over 250 Å) is targeted. The etching operation is terminated at a stage where the silicon nitride film (32) underneath becomes bared to the bottom. The silicon nitride film (46) should remain at an indefinite thickness outside the dual damascene structure at this stage, and whether or not this silicon nitride film (46) should be removed depends on the structure of a device which is to be overlappingly formed above the remaining structure after the foregoing processes as well as on the required device performances. As far as mechanisms for removing it completely are concerned, a wet etching mechanism may be preferably used, although it can also be removed by means of dry etching. In a case where it is completely removed, a high-permittivity silicon nitride film in effect becomes removed from the wire interlayer space, based on which the parasitic capacitance between wire layers, which is a factor that hinders high-speed actions, can be minimized. In the case of a technical field, wherein a high action speed is emphasized as a decisive factor that determines the value of a commercial product, as in the case of a logic device, it would be feasible either to remove the silicon nitride film (46) or to use a material the permittivity of which is relatively low and the etching rate of which is lower than that of the silicon oxide film (42) in place of the silicon nitride film (46), as shown in FIG. 25.

Figure 26:
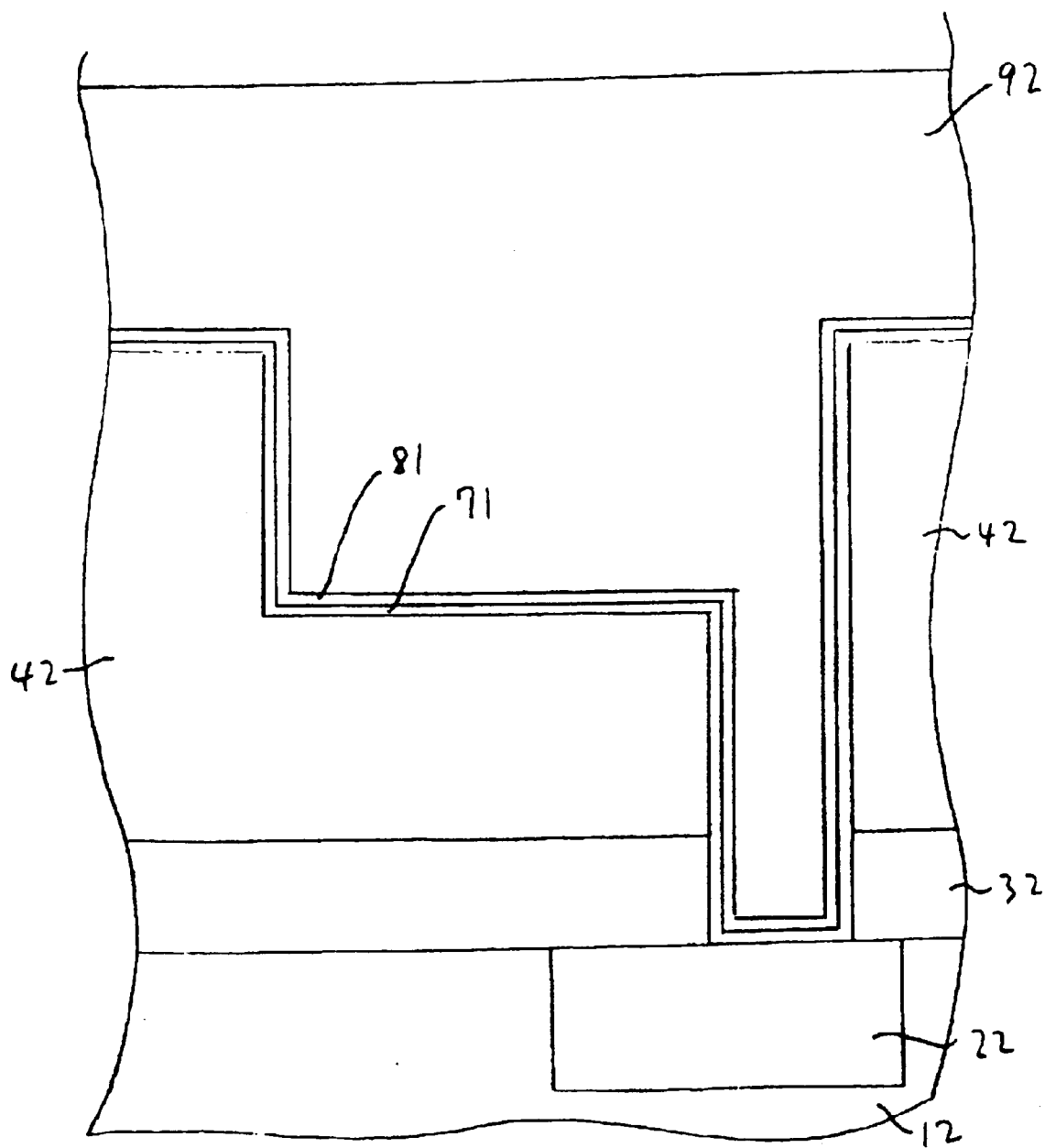
FIG. 26 is a diagram which shows a cross-sectional view of still another process in progress with regard to the second embodiment of the present invention.

During the subsequent process, a copper (Cu) wire layer is formed on the remaining structure obtained as a result of the foregoing processes (dual damascene window). First, the tantalum nitride (TaN) film (71) (500 Å) is formed thinly by means of sputtering, and next, the copper (Cu) seed layer (81) (1,000 Å) is formed thinly by means of sputtering, as shown in FIG. 26.

Figure 27:
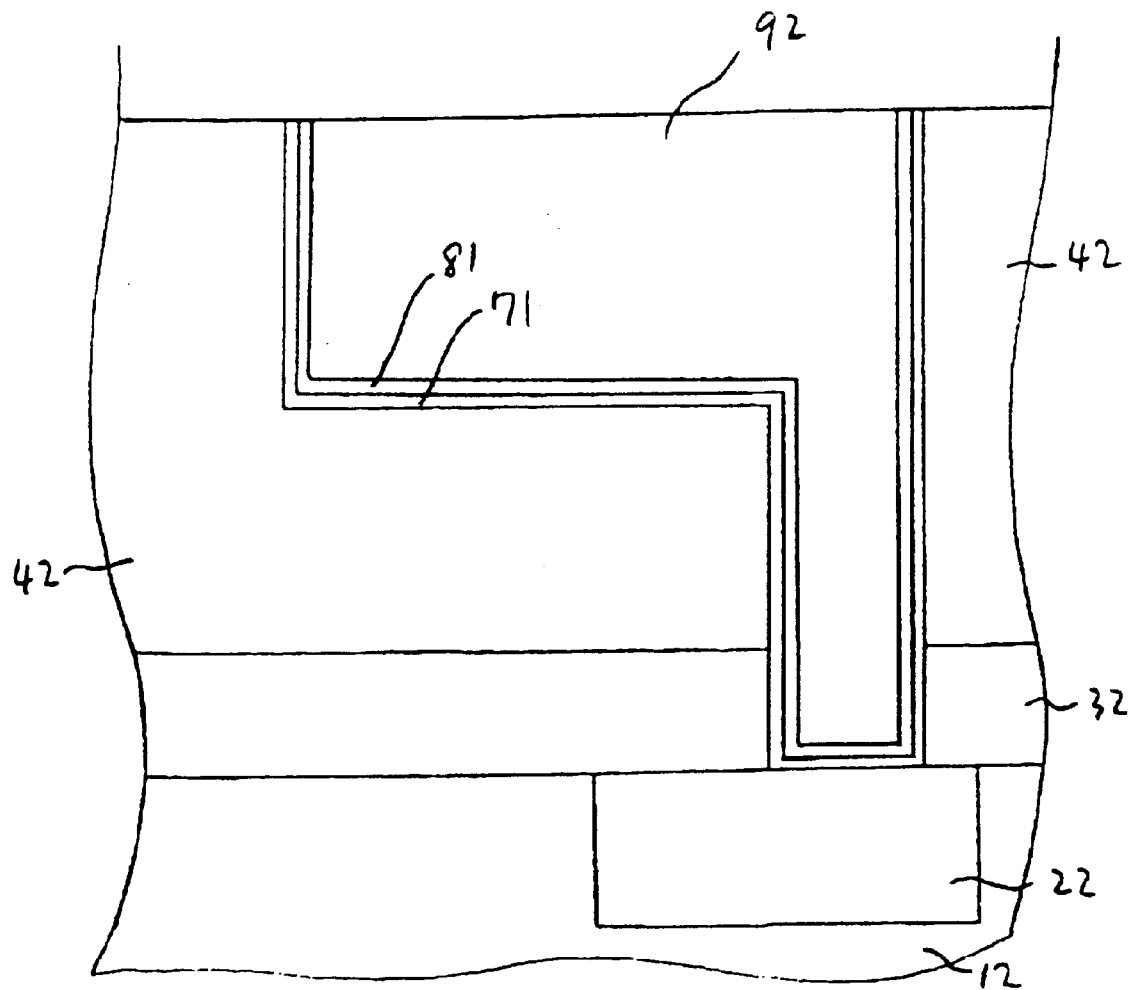
FIG. 27 is a diagram which shows a cross-sectional view of still another process in progress with regard to the second embodiment of the present invention.

Next, the copper (Cu) layer (92) is formed thickly based on the plating method by using the copper (Cu) seed layer (82). The thickness of the layer hereby formed must be large enough for the portion which has filled the dual damascene window to bulge from said window, as shown in FIG. 27.

The copper (Cu) layer (92) is then etched back based on the CMP (chemicomechanical polish) method, and the extraneous copper (Cu) layer (92) outside the dual damascene window is then removed, as a result of which a copper (Cu) dual damascene wire structure becomes finished. Prior to the filmwise formation of the wire material, the bared copper (Cu) layer (92) surface is washed by means of a chemical solution treatment. Such a washing operation may be carried out based on a general chemical solution treatment method.

Figure 28:
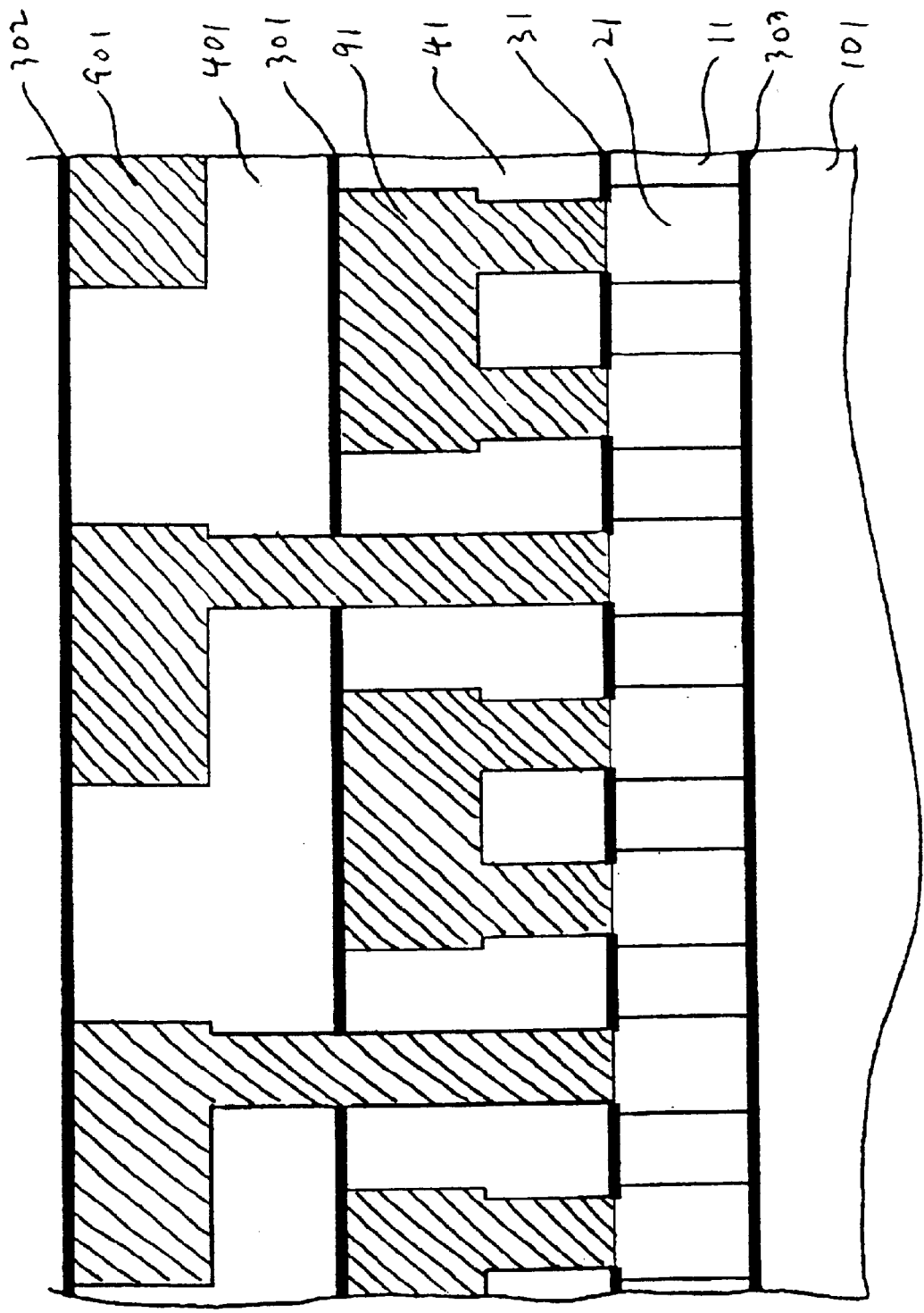
FIG. 28 is a diagram which shows a cross-sectional view of a multi-layer wire connection embodiment to which the present invention can be applied.

FIG. 28 is a diagram cross-sectional view of a multi-layer wire connection system to which the present invention can be applied, and it graphically instantiates the structures explained above with reference to the first and second application embodiments as structural examples of interlayer wire connection embodiments.

As far as the structure shown in FIG. 28 is concerned, the silicon nitride film (303) is first formed blanketwise above the base (101), and after the interlayer insulating film (11) has been formed above it blanketwise, the silicon nitride film (31) is further formed above it blanketwise. After a window has subsequently been patterned and opened on the obtained structure based on the dry etching method, the copper (Cu) wire layer (21) is further formed by implementing a thick film formation process based on the plating method and an etch-back process based on the CMP (chemicomechanical polish) method in proper order. This wire layer (21) may, furthermore, be etched back based on the CMP (chemicomechanical polish) method after a tungsten (W) wire layer has blanketed its entire plane based on the CVD (chemical vapor-phase growth) method. A dual damascene window, furthermore, is opened according to procedures similar to the dual damascene processes disclosed earlier with regard to the first and second embodiments in such a way that the copper (Cu) wire layer (21) will be bared to the bottom of the interlayer insulating film (41), and copper (Cu) is then formed in its interior blanketwise based on the previously mentioned technique. A deep window which reaches the interlayer insulating film (41) from the interlayer insulating film (401) shown in FIG. 28 has yet to be formed in this process. Next, the silicon nitride film (301) is formed blanketwise on the surface which has been flattened based on the CMP (chemicomechanical polish) method. The interlayer insulating film (401) is then formed blanketwise on this surface based, for example, on the plasma CVD method, as in the cases of the other interlayer insulating films. Subsequently, an opening is formed according to procedures comparable to those for forming the dual damascene window discussed earlier. Although it is not shown in the figure, a silicon nitride film has been preliminarily coated on the surface of the interlayer insulating film (401), and its step differential is transferred to the base by duplicating the procedures of the present invention discussed earlier. The window thereby formed is deep to the extent that the surface of the wire layer (21) becomes bared to the bottom. Next, a thin TaN (tantalum nitride) film which serves as a copper diffusion preventive barrier is formed on the inner wall of this deep dual damascene window, followed by the formation of a thin copper (Cu) seed layer on it blanketwise. A thick copper (Cu) layer is then formed based on the plating method. After the copper (Cu) seed layer (901) has subsequently been etched back based on the CMP (chemicomechanical polish) method, the silicon nitride film (302) is formed on its entire plane blanketwise, and a transition is then made to a process whereby an upper wire layer is formed (not shown in the figure). The multi-layer wire connection embodiment to which the present invention can be applied has thus been explained with reference to FIG. 28.

Incidentally, the present invention is in no way limited to the constitutions instantiated above in the first and second embodiments of the present invention, and various modification examples may be freely conceived. A silicon nitride film has, for example, been discussed as an example of double-layer film to be used as a mask on which a depression has been formed in place of a single-layer film, and it is also possible to use a double-layer film the first layer of which is constituted by a silicon nitride film and the second layer of which is constituted by a polycrystalline silicon film or a double-layer film the first layer of which is constituted by a silicon nitride film and the second layer of which is constituted by a titanium nitride film. In a case where the etching rate differential between the two films is designated as follows: first layer: second layer=approximately 1:2 or higher, satisfactory results can be obtained, and in a case where a double-layer film the first layer of which is constituted by a silicon nitride film and the second layer of which is constituted by a titanium nitride film is used, it is desirable for the titanium nitride to be etched under the following conditions by using a chlorine-containing etchant under the following etching conditions: $Cl_2/BCl_3$=60/60 sccm; source/bias 800/50 W; pressure: 8 mTorr; titanium nitride etching rate=3,000 Å/min.; silicon nitride film etching rate=700 Å/min.

Next, auxiliary characteristics of the present invention will be mentioned.

1. As far as the present invention is concerned, an interlayer insulating film is deeply processed by using a hard mask, which is advantageous over a case where a resist mask of the prior art is used in terms of the processing precision. An etching rate microloading phenomenon (i.e., phenomenon whereby the etching rate differs depending on the pattern size), which is peculiar to resist masks, can be thus avoided.

2. Since a resist mask is used only for etching a hard mask in the present invention, the resist coating film thickness can be minimized, which in turn contributes to an improved photolithographic processing precision and to the facilitation of the resist peeling.

Additionally, an embodiment corresponding to a capacitor rather than wire layer embodiments is explained below. The dual damascene structures have been employed as wire layers in the application embodiments of the present invention disclosed above, but in addition to such wire application examples, they can also be used for forming capacitor films. In this case, a thin first electroconductive film is formed blanketwise along the profile planes of the downwardly protruding dual damascene window, which is shown to have been opened in FIG. 15. Either the CVD (chemical vapor-phase growth) method or the sputtering method may be used, although it would be more desirable to form it blanketwise based on the CVD (chemical vapor-phase growth) method with the exception of a case where an Al (aluminum) wire material, which is difficult to form based on the CVD (chemical vapor-phase growth) method, is used. Most importantly, the objective film cannot be cleanly formed blanketwise based on the sputtering method due to the recoils of particles from the wall plane while said particles are induced to grow physically in the vapor phase vis-a-vis a small window. In a case where the CVD (chemical vapor-phase growth) method is used, the use of doped amorphous silicon is conceivable. A thin doped amorphous silicon film which has been formed blanketwise along the inner wall of the downwardly protruding dual damascene window is shallowly oxidized thermally. Alternatively, a silicon oxide film or silicon nitride film is formed blanketwise based on the CVD (chemical vapor-phase growth) method. Subsequently, another doped amorphous silicon film is formed blanketwise on the surface of said thermally oxidized film or CVD insulating film in an overlapping fashion. In such a case, a sufficiently thick film into which the downwardly protruding dual damascene window has been buried completely is formed in a somewhat bulging fashion. The portion bulging from the window is then removed by means of a dry etching process which uses a resist mask, as a result of which a capacitor which includes said two doped amorphous silicon films respectively as an accumulation electrode and an oppositional electrode is completed. In a case where such a capacitor film is formed, it is not always necessary to form the insulating film (21) as a base, and there is no need for the interlayer insulating film (11) formed underneath to be constituted by an insulator. As far as a simple practical method is concerned, of the specified capacitor films, the accumulation electrode is retrieved from the lower side, and the lower side of the window is electrically connected to an impurity layer which has been configured by doping a high-concentration impurity into a semiconductor substrate in such a way that the oppositional electrode will be retrieved from the upper side, whereas corresponding electrodes are retrieved from a thick doped amorphous silicon film which is formed on the upper side of the dual damascene structure and which fills the window.

The following effects are imputed to the present invention.

Despite the inability of a resist mask to be positioned and aligned in a self-matching fashion during an operation for opening a dual damascene window, which could otherwise be fatal, virtually identical dual damascene wire layer cross-sectional areas and contact areas can be duplicated in stable fashions based on simple processes, based on which the device yield is significantly improved.

Since there is no need to use a resist as a mask for forming the opening, furthermore, the prospect of the degradation of the contact profile by the mask step differential can be precluded.

In a case where copper (Cu) is employed as a lower wire layer, furthermore, there is no need to take into account the problem of the oxidation of copper due to ashing even in a state where the lower wire layer is bared to the lower portion of the window in that there is no need to use a resist as a mask for forming the opening, and therefore, it becomes unnecessary to coat a protective layer in the context of protecting the copper from oxidation during the ashing operation.

The dual damascene structure can, furthermore, be finalized as a result of a singular etching process whereby a mask depression is directly transferred to an interlayer insulating film, and accordingly, a singular interlayer insulating film suffices. In a case where an interlayer insulating film is constituted by laminating multiple insulating films with mutually different etching rates, a dual damascene structure can be formed with ease based on a technique of the prior art, but at present, one of the utmost goals is to lower the permittivity of an interlayer insulating film, and the selection of an insulating film endowed with a sufficient etching rate differential is an extremely challenging issue, and therefore, the utility value of the laminate structure may be said to be immense.

What is claimed is:

1. A method for manufacturing a semiconductor device, comprising the steps of:

forming a second film uniformly on the surface of an interlayer insulating film being formed on the surface of a semiconductor substrate or a wire layer via a first film;

patterning a first mask layer above said second film so as to selectively expose the surface of said second film;

removing said second film selectively by using said first mask layer to the extent that said interlayer insulating film is exposed and thereby creating a step differential within said second film;

patterning a second mask layer so as to form an opening exposing the lower side of said step differential at the bottom thereof;

etching said second film so as to at least partially expose said interlayer insulating film, and subsequently etching said interlayer insulating film; and removing said second mask layer and thereafter etching said second mask layer and subsequently etching said interlayer insulating film so as to expose said first mask layer and thereby configuring a window having a step differential on said interlayer insulating film.

2. The method for manufacturing a semiconductor device according to claim 1, which further comprises the steps of:

removing said first film exposed at the bottom of said window so as to selectively expose the surface of said semiconductor substrate or wire layer; and forming an electroconductive layer which covers the inner walls of said window.

3. The method for manufacturing a semiconductor device according to claim 2, wherein said electroconductive layer is Constituted by copper and which includes the additional step of forming copper blanketwise at a thickness equal to or larger than the thickness of said window based on a plating method, whereby said copper is etched based on the chemicomechanical polish method so that said electroconductive layer remains selectively alone within said window.

4. The method for manufacturing a semiconductor device according to claim 2, wherein said electroconductive layer includes materials selected from the group consisting of gold, silver, copper, aluminum, titanium, tantalum, molybdenum, tungsten, cobalt, titanium nitride, tantalum nitride, tungsten nitride, molybdenum nitride, and titanium-tungsten.

5. The method for manufacturing a semiconductor device as in any one of claims 1–4, in which said first film is constituted by a material selected from the group consisting of a silicon oxynitride film and a silicon carbide film.

6. The method for manufacturing a semiconductor device as in any one of claims 1–4, in which said interlayer insulating film is constituted by a material selected from the group consisting of a silicon oxide film, a fluorine-added silicon oxide film, an organic compound film and a porous compound film.

7. The method for manufacturing a semiconductor device as in any one of clams 1–4, in which said second film is constituted by a material selected from the group consisting of a silicon oxynitride film and a silicon carbide film.

8. The method for manufacturing a semiconductor device as in any one of claims 1–4, in which said interlayer insulating film includes laminated multiple mutually different layers, and in the case wherein the opening reaches the bottom of said interlayer insulating film, the etching conditions are optimized so that the etching rate of the lower layers become lower than that of the upper layers among said multiple layers.

9. The method for manufacturing a semiconductor device as in any one of claims 1–4, in which said second film includes laminated multiple mutually different layers, and wherein during said creation of said step differential within said second film, the etching conditions are optimized so that the lower layers of said multiple layers function as an etching stopper and the upper layer alone is selectively removed.

10. The method for manufacturing a semiconductor device as in any one of claims 1–4, in which the thickness of said second film entails an optical constant which is optimal for patterning said first mask layer and said second mask layer based on the photolithographic method, said film thickness being designated sufficiently as a mask for etching said interlayer insulating film.

11. The method for manufacturing a semiconductor device as in any one of claims 1–4, in which said opening configured prior to the patterning of said second mask layer is configured so that the step differential of said second coating film is not exposed.

12. The method for manufacturing a semiconductor device as in any one of claims 1–4, in which said-opening which is configured prior to the patterning of said second mask layer is configured in such a way that the step differential proper of said second coating film will be bared to the bottom.

13. A method for manufacturing a semiconductor device, comprising the steps of:

forming a second film uniformly on the surface of an interlayer insulating film being formed on the surface of a semiconductor substrate or a wire layer via a first coating film;

patterning a first mask layer above said second film so as to selectively expose the surface of said second film;

removing said second film selectively by using said first mask layer to the extent that said interlayer insulating film is not exposed and thereby creating a step differential within said second film;

patterning a second mask layer so as to form an opening exposing the lower side of said step differential at the bottom thereof;

etching said second film so as to at least partially expose said interlayer insulating film, and subsequently etching said interlayer insulating film;

removing said second mask layer and thereafter etching said second mask layer, and subsequently etching said interlayer insulating film so as to expose said first mask layer and thereby configuring a window having a step differential on said interlayer insulating film;

configuring a step differential by removing said first film exposed at the bottom of said window so as to selectively expose the surface of said semiconductor substrate or wire layer;

configuring a first electroconductive layer so that the inner wall of said window becomes covered; and forming an insulating layer which covers the entire plane of said first electroconductive layer and forming a second electroconductive layer on the surface of said insulating layer.

* * * * *